US008829420B2

(12) United States Patent
Goodwin et al.

(10) Patent No.: US 8,829,420 B2
(45) Date of Patent: Sep. 9, 2014

(54) TWO DIMENSIONAL ENCODER SYSTEM AND METHOD

(75) Inventors: Eric Peter Goodwin, Tucson, AZ (US); Daniel Gene Smith, Tucson, AZ (US)

(73) Assignee: Nikon Corporation (JP)

( * ) Notice: Subject to any disclaimer, the term of this patent is extended or adjusted under 35 U.S.C. 154(b) by 357 days.

(21) Appl. No.: 13/134,461

(22) Filed: Jun. 8, 2011

(65) Prior Publication Data

US 2012/0032067 A1    Feb. 9, 2012

Related U.S. Application Data

(60) Provisional application No. 61/397,256, filed on Jun. 9, 2010.

(51) Int. Cl.
*G01D 5/347*   (2006.01)
*G01B 11/00*   (2006.01)
*G03F 7/20*    (2006.01)
*G02B 27/42*   (2006.01)
*G01D 5/38*    (2006.01)

(52) U.S. Cl.
CPC .......... *G01B 11/002* (2013.01); *G03F 7/70775* (2013.01); *G02B 27/4255* (2013.01); *G01D 5/38* (2013.01)
USPC ...................... 250/231.1; 250/237 G; 359/834

(58) Field of Classification Search
USPC ............................ 250/231.13–231.18, 237 G
See application file for complete search history.

(56) References Cited

U.S. PATENT DOCUMENTS

| 7,238,931 | B2 | 7/2007 | Nabeshima et al. | |
| 2006/0011821 | A1* | 1/2006 | Pal | 250/231.13 |
| 2007/0146722 | A1* | 6/2007 | Trutna et al. | 356/487 |

* cited by examiner

*Primary Examiner* — Tony Ko
(74) *Attorney, Agent, or Firm* — Yakov Sidorin; Quarles & Brady LLP; Lawrence R. Oremland

(57) ABSTRACT

An encoder system and method are provided, that is designed to improve 2D encoder systems and methods in areas such as accuracy, compactness, stability, resolution, and/or light efficiency. Moreover, the system and method of this invention provides a new concept in a retroreflector that while particularly useful in applicants' system and method, is believed to have more general utility in optical imaging systems and methods.

20 Claims, 32 Drawing Sheets

In-Line Gamma Encoder

In-Line Gamma Encoder

In-Line Gamma Encoder

In-Line Gamma Encoder

2D Grating

TWO DIMENSIONAL ENCODER SYSTEM AND METHOD

RELATED APPLICATION/CLAIM OF PRIORITY

This application is related to and claims priority from provisional application Ser. No. 61/397,256, filed Jun. 9, 2010, which provisional application is incorporated by reference herein.

INTRODUCTION

The present invention relates to a two dimensional (2D) encoder system, to a method of providing 2D encoder functions, that is useful e.g. in performing metrology for an optical imaging system that images a substrate that is supported on a substrate stage. The present invention is specifically designed to improve features such as accuracy, compactness, stability, resolution, and/or light efficiency of a two dimensional (2D) encoder system. In addition, the present invention provides at least one new concept in a retroreflector that is useful in such a system and method.

In the applicants' experience, 2D encoder systems and methods generally provide different encoder heads for use with 2D gratings (that are supported on a substrate stage). Such systems and methods have issues with their accuracy, compactness, stability, resolution, and/or light efficiency, and applicants believe such systems can be improved in any or all of those areas.

SUMMARY OF THE PRESENT INVENTION

Applicants' system and method are designed to improve 2D encoder systems and methods in each of the foregoing areas (e.g. accuracy, compactness, stability, resolution, and/or light efficiency) and are preferably designed to improve such systems and methods in all of the foregoing areas. Moreover, applicants' system and method provides a new concept in a retroreflector that while particularly useful in applicants' system and method, is believed to have more general utility in optical imaging systems and methods.

More specifically, applicants' system and method are designed to provide improvements in the foregoing areas in the following ways a. Accuracy and Resolution are improved by producing interference of a pair of measurement beams that are each diffracted at least twice from a grating on a stage that supports the substrate b. Compactness is improved by an encoder head that comprises a single, integrally formed optical (e.g. glass) component ("integrally formed" means either formed in one piece, or formed of optical (e.g. glass) members that are joined directly to each other (e.g. by adhesive)), so that they effectively function as close as possible to a component formed in one piece c. Stability is improved by designing the encoder head to produce equal beam paths through the optical members and air in the spaces between portions of the optical members d. Light Efficiency is improved by designing the encoder head to make the most efficient use of available light from the source, and to control the beams in a manner that uses the grating to combine the beams. Light efficiency is also improved because the system and method are designed so that (a) the grating functions as a beam splitter, and (b) the grating functions as a beam combiner.

An additional feature of the invention is the provision of at least one embodiment where the encoder head and grating are configured such that the measurement beam incidence locations lay substantially along a single line, providing the system with a relatively narrow beam footprint on the grating.

Also, the encoder head includes, as one of the optical members that form the encoder head, one or more retroreflectors, each of which has a thickness that is about the thickness of a measurement beam (meaning that the thickness of the retroreflector is as close as possible to the thickness of a measurement beam, but is not thinner than a measurement beam). Such retroreflectors are believed to provide a new paradigm in the design of retroreflectors, and contribute to several of the improvements noted above.

In addition, at least one embodiment includes features producing polarization isolation and removes stray light, which also contributes to several of the foregoing improvements.

With the system and method of the present invention, the use of 2D encoder gratings (e.g. on the substrate stage), and producing interfering measurement beams in both dimensions of the grating reduces the number of encoder read heads required to monitor the stage position over its entire travel range. This also reduces the area on the stage surface required for encoder gratings, since a single area can be used for both x and y measurement. Further, this allows the size, and also the moving mass of the substrate stage to decrease, which has many advantages, e.g. higher stage acceleration and/or reduced electrical power requirements in order to move the stage.

Still further, preferred versions of the present invention provide one or more of the following features:

a. The encoder system and method is configured to produce interfering measurement beams with 3 degrees of freedom (x, y, z) instantaneously and simultaneously b. The encoder system and method (i) is configured to produce interfering measurement beams related to changes in the relative position of the grating and the encoder head in at least the x, y and z directions, and (ii) provides at least 0.06 nm resolution in the x and y directions, and at least 0.2 nm resolution in the z direction.

In a system and method according to the present invention, the encoder head is characterized in that it can read multiple diffraction orders from the grating(s) that are produced from a source that comprises a single input beam.

These and other features of the present invention will become apparent from the following detailed description and the accompanying drawings and exhibit.

BRIEF DESCRIPTION OF THE DRAWINGS AND EXHIBIT

FIGS. 1-7 show a version of the system and method of the present invention, known as the Shuriken version FIGS. 8-28 show versions of the system and method of the present invention, known as the Gamma version (FIGS. 8-10 show a version referred to as the Solid Gamma, FIG. 11 shows a version referred to as the Air Gamma, FIGS. 12-15 show the light paths in the solid and Air Gamma, FIGS. 16-23 show a version referred to as the In Line Gamma, and FIGS. 24-28 show the light paths in the In Line Gamma;

Exhibit A shows color images of FIGS. 1-32.

DETAILED DESCRIPTION

In the applicants' provisional application, which is incorporated by reference herein, 3 general types of systems and methods are disclosed for implementing the present invention. They are referred to as the Littrow, the Shuriken and the Gamma concepts. The following detailed description focuses on two of those concepts, the Shuriken and the Gamma, to demonstrate the features of the present invention that are reflected in the claims.

According to a basic concept of the present invention, an encoder system and method comprises an encoder head and a two dimensional (2D) grating that can be supported on a substrate stage. The encoder head and the 2D grating are moveable relative to each other and are configured to produce interfering measurement beams in both dimensions of the grating with a phase difference between those interfering measurement beams related to that relative movement. The 2D grating is configured to diffract the measurement beams whose interference is related to relative movement of the encoder head and the grating (and thereby to relative movement of the encoder head and the substrate stage). In accordance with the present invention, at least a pair of the interfering measurement beams are each diffracted at least twice by the grating as the encoder head and grating move relative to each other.

In a particularly preferred embodiment, the encoder head comprises a single, integrally formed optical component through which the pair of measurement beams pass. Moreover, the encoder head includes one or more retroreflectors, each of which has a thickness that is about the thickness of a measurement beam (meaning that the thickness of the retroreflector is as close as possible to the thickness of a measurement beam, but is not thinner than a measurement beam). Still further, the encoder head includes one or more optical members and one or more spaces between portions of the optical members, and the encoder head is configured to direct measurement beams along substantially equal paths through the optical members and the spaces between the portions of the optical members. Also, the encoder head and the 2D grating are configured such that in some embodiments of the present invention the grating functions as a beam splitter, and in some embodiments the encoder head and the 2D grating are configured such that the grating functions as a beam combiner. Still further, the encoder head is configured to provide polarization isolation of the measurement beams. Additionally, the encoder head and grating are configured such that the measurement beam incidence locations lay substantially along a single line, thereby providing the system with a relatively narrow beam footprint on the grating.

Figure 29:
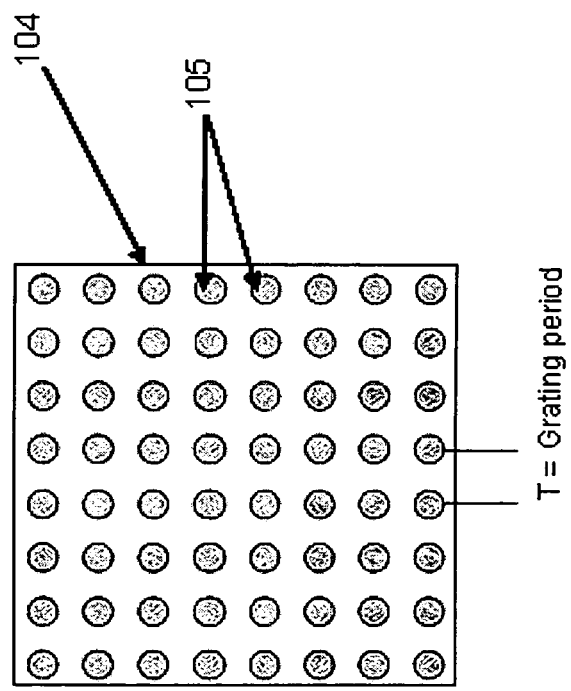
FIG. 29 shows a 2D grating pattern that is useful in the practice of the present invention.

As shown in FIG. 29, a 2D grating 104 that can be used with an encoder head, according to the present invention, comprises a plate like member with either a set of round (as shown) or square pedestals 105 rising above the plate like member, or a set of round or square holes in the plate like member. The nominal value of T, the grating period for the inventions in this application is 2 um. The plate like member with the 2D grating would be attached to the substrate stage and located on a portion of the stage that is not underlying the substrate, but rather lies to the side of the substrate.

FIGS. 1-7 illustrate the Shuriken version of applicants' invention. The Shuriken system 100 comprises the two dimensional (2D) encoder grating 104 (referred to herein as a 2D grating), that diffracts a light beam that impinges on the grating. In accordance with the invention, the beams are diffracted in both dimensions of the grating. The system also includes an encoder head 106 that is formed by several pieces of glass that can be adhesively secured to each other, preferably by an adhesive that transmits light, with as little scatter as possible. The pieces of glass include retroreflectors 108, four of which are illustrated in FIGS. 1-7. Each retroreflector 108 has a novel configuration that is part of this invention. That novel configuration comprises a pair of prisms 110 and a portion 112 that extends between the prisms 110. A retroreflector can be a solid member, made completely of glass, or it can be what applicants' call an "air retroreflector" which is formed by a pair of corner prisms and a reflector (mirror) extending between the prisms that effectively forms the portion 112. A light beam that is transmitted by a retroreflector 108 would be reflected from each prism and travels along the portion 112 between the prisms (the light beam is reflected from a surface of the portion 112 as it travels between the prisms). These three reflections create the same retroreflective properties of a conventional corner cube retroreflector. The thickness of the retroreflector 108, i.e. in FIG. 7 the dimension "t" of the portion 112 along which the light beam travels, is about the size of the light beam, meaning it has a minimum thickness that is as close as possible to the thickness of the light beam, but is not thinner than the light beam. Thus, for a light beam with a thickness of about 3 mm, and allowing for tolerances that would be required in the construction of the retroreflector, the thickness of the portion 112 of the retroreflector would be on the order of about 4 to 5 mm. In applicants' experience, that is a relatively small thickness for a retroreflector that results in no beam overlap between input and output beams of a certain diameter. In other words, the ratio between the beam diameter and retroreflector thickness when the input and output beams do not overlap at all is minimized in retroreflector 108. In accordance with the present invention, in the course of controlling light beams, each retroreflector 108 transmits a diffracted light beam from the grating back toward the grating as its function as a retroreflector. Moreover, each diffracted light beam is diffracted in both dimensions of the grating, as the encoder head 106 and the grating 104 move relative to each other.

The Shuriken concept is consistent with the concepts shown and described in the provisional application. It is designed to function with a single light source, e.g. a 3 mm beam size laser light source, and provide high accuracy measurements in the x, y, and z directions. Applicants also note that such a relative large beam size makes the system and method of the invention less sensitive to scale errors by averaging scale errors over a larger region on the grating (this is why applicants try to have the largest beam diameter possible)

The encoder head 106 is preferably a single piece of glass, made up of several retroreflectors 108 that are glued together or connected using optical contacting to form the full encoder head. The light source that generates the input beam is a monochromatic point source, preferably a laser beam.

The encoder system and method of the present invention produces at least two interference measurement beams that are then sent to a detector module located either just after the encoder head, or sent to a detector module via an optical fiber so that the heat generating photodiode detectors are far from the encoder head. The detector module would include photodiodes upon which the interference measuring beams impinge. The interfering beams are related to relative movement of the substrate, and the data generated enables information related to the relative movement of the substrate stage to be produced.

One measurement option is for the detector module to comprise at least 4 simultaneous measurements of the two interference measurement beams in each of the x and y dimensions, where the phase between the two beams is shifted by π/2 radians at each subsequent detector. This can be done since the two beams are orthogonally polarized when they enter the detector module. It is important to note that this technique allows the phase to be measured instantaneously at the rate of the photodiodes, so any motion of the encoder grating 104 or other system changes will not cause false position measurements due to the time it takes to make a measurement.

$$\phi = \tan^{-1}\left(\frac{I_4 - I_2}{I_1 - I_3}\right)$$ Equation 1

Equation 1 is a standard equation for calculating the phase for a set of 4 phase shifted irradiance values.

It should be noted that in the system and method of this invention, all the optics are contained in a single block of glass, which should have a fairly uniform temperature. In addition, the two interfering measurement beams for each of the x and y measurements have equal beam paths through the optical members that make up the encoder head and air in the spaces between portions of the optical members, so any uniform temperature change of the encoder head will not cause a measurement error, to first order. This feature enhances the stability of the system and method of the present invention. Also, alignment is much less likely to drift over time since all the components are directly attached to each other using either optical contacting or adhesive.

In order to handle Z measurements, the input beam is split into a reference and measurement beam by polarization beam splitters (described below in connection with FIGS. 5-7). The reference beam is then manipulated, e.g. in the Shuriken by additional polarization beam splitters, and mirrored surfaces, so that it becomes common path with the measurement beam. The measurement beam is incident on the grating twice, travels equal path with the reference beam and is then made collinear with the reference beam.

The Shuriken concept (FIGS. 1-7) is designed such that, given a certain pitch grating (e.g. as shown in FIG. 29), the concept enables 4× sensitivity to x and y motions, along with no signal contrast reduction due to tilts of the grating, and can achieve a nominal dead path (both glass and air) of zero, allowing a relaxed tolerance on the frequency stability of the light source, all with a single beam incident on the 2D grating for improved light efficiency.

The Shuriken concept is also consistent with applicants' objective to reduce the number of encoder read heads required to monitor the relative movement of the grating and encoder head, to thereby monitor the stage position over its entire travel range. This also reduces the area on the substrate stage surface required for the grating(s), since a single 2D grating area can be used for both x and y measurement. In much of the prior of the art, different grating scales are required for measuring x and y.

Working with a fairly coarse grating pitch (for example, 2 um), means that the diffracted angles from the grating can be relatively small, depending on the wavelength. Equation 2 is the grating equation which shows the relationship between wavelength, pitch, and the angles of incidence ($\theta_i$) and diffraction ($\theta_d$), where m is the grating order:

$$T(\sin\theta_i + \sin\theta_d) = m\lambda$$ Equation 2

Ideally, a single encoder read head 106 would be able to measure x, y and z positions of a 2D encoder grating 104 relative to the head. Although homodyne interferometry is a possibility, heterodyne interferometry has some advantages, and is considered as the preferred embodiment of this new encoder system and method. An important limitation of a heterodyne system is the available power from the source is small. Therefore, the Shuriken concept provides an encoder head design that works with a single beam incident on the 2D grating 104 (FIG. 29) in order to utilize as much of the available light power as possible. Thus, in the Shuriken concept, the encoder head 106 and grating 104 are configured such that the grating effectively functions as a beam splitter, to create two pairs of measurement beams.

Another objective provided by the Shuriken concept is that each measurement beam is incident on the 2D grating 104 twice, where each measurement light beam goes through a retroreflector 108 between the two passes. This ensures that the two measurement beams (or measurement beam and reference beam, where the reference beam may not hit the grating at all) emerge from the system parallel to each other (even with the presence of stage/grating tilt), so that no fringes are created across the beam diameter, and fringe contrast remains high as the 2D grating tilts.

In addition, for a coarse grating (in this case, 2 um, but it is not limited to this pitch), it is important to create an x-measurement signal by combining a (+1, +1) and (−1, −1) diffracted beams, thus achieving a 4× sensitivity to grating motion, which improves the resolution of the system and method. The sinusoidal interference signal will now have a period of 2000 nm/4=500 nm. Assuming the heterodyne electronics are capable of resolving one part in 2^13, this means we have a resolution of our least significant bit of 0.061 nm.

Figure 1:
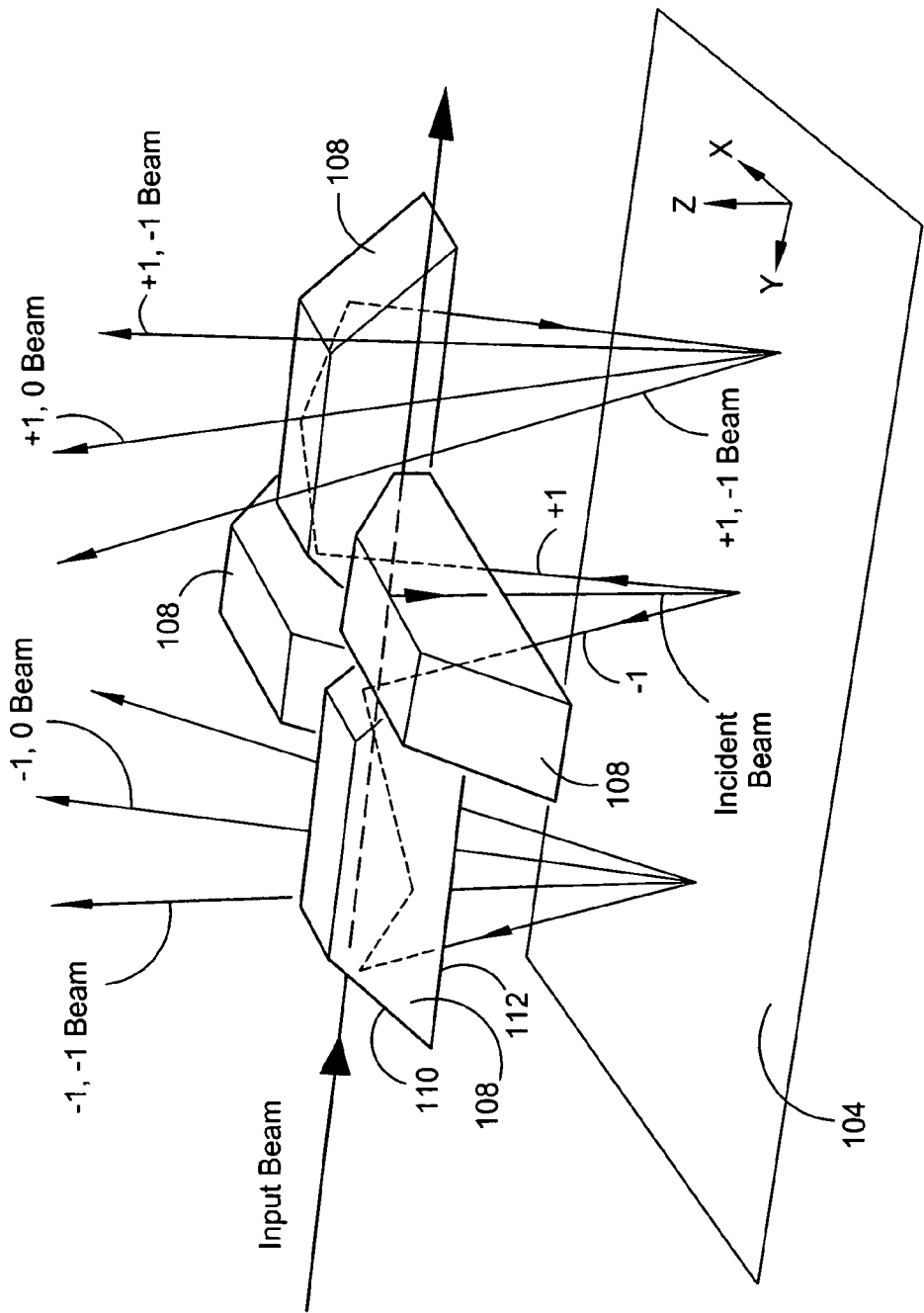
Figure 2:
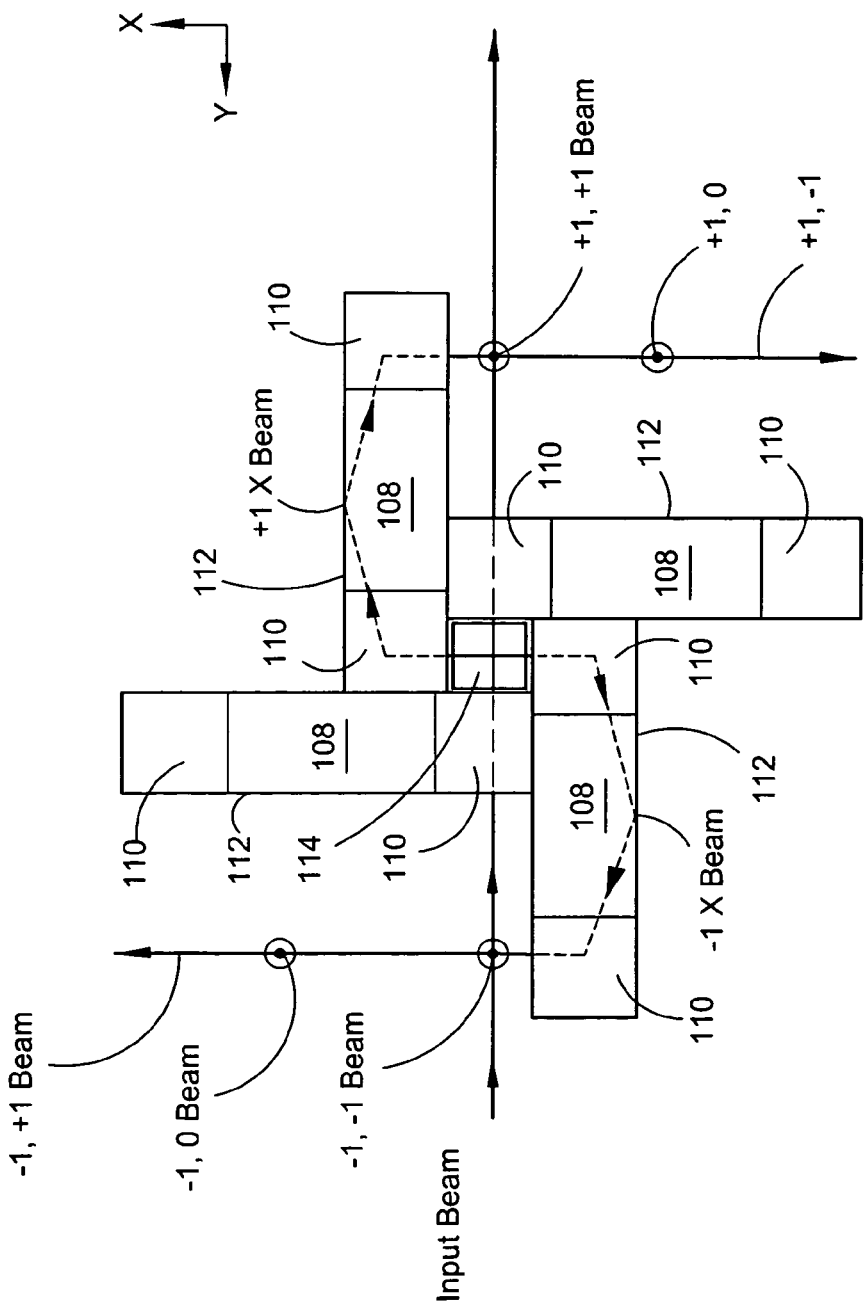

FIG. 1 shows a basic aspect of the Shuriken concept, where a single beam is incident on the 2D encoder scale 104 at normal incidence, with a wavelength of 632.8 nm. Therefore, the first order diffracted light (only x orders are shown in FIG. 1) is at an angle of 18.44°. The +1 order goes to one of the glass retroreflectors 108 that looks like a Dove prism, although it is functioning as a retro-reflector. FIG. 2 shows a top view of these retroreflectors 108 in action. The light refracts on entering the bottom of the prism 110 of a retroreflector and reflects off one of the 45° faces, making the beam lie in the xy plane. It then reflects off the back side of the prism 110 for the second reflection, and finally makes a third reflection off the other 45° face, refracts again when exiting out the bottom of the prism 110 and returns to the 2D grating 104 for a second pass. As can be seen in FIG. 1, the second pass beam creates 3 beams: (+1, +1), which is used for half of the x measurement; (+1, 0), shown in red in exhibit A, which is unused in this embodiment; and (+1, −1), which nominally has no x sensitivity and is also unused.

As can be seen in FIG. 2, the (+1,+1) and (−1,−1) x measurement beams emerge nearly perpendicular to the 2D encoder grating 104; in fact, they are parallel to the input beam, regardless of the tilt angle of the 2D encoder grating about the x and y axes.

Figure 3:
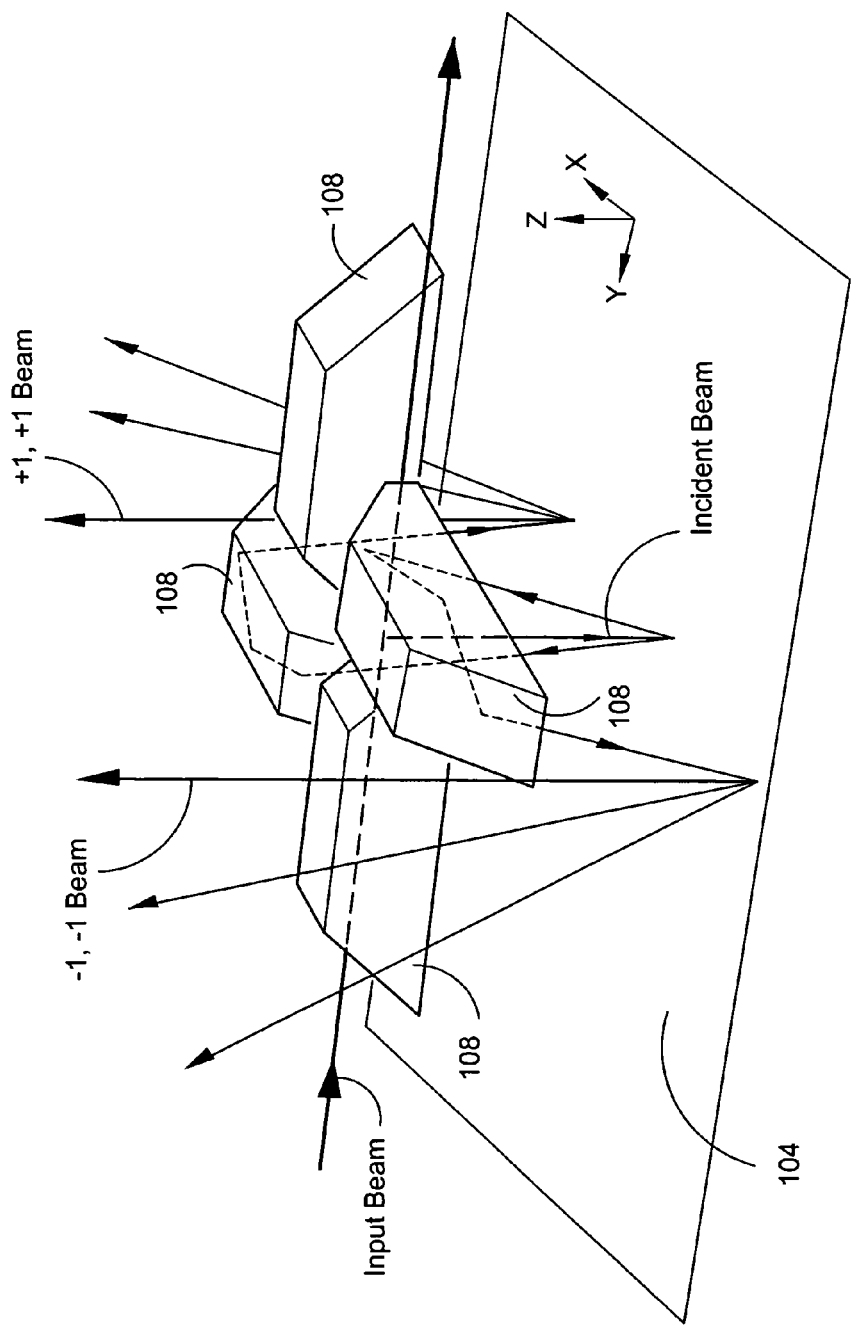
Figure 4:
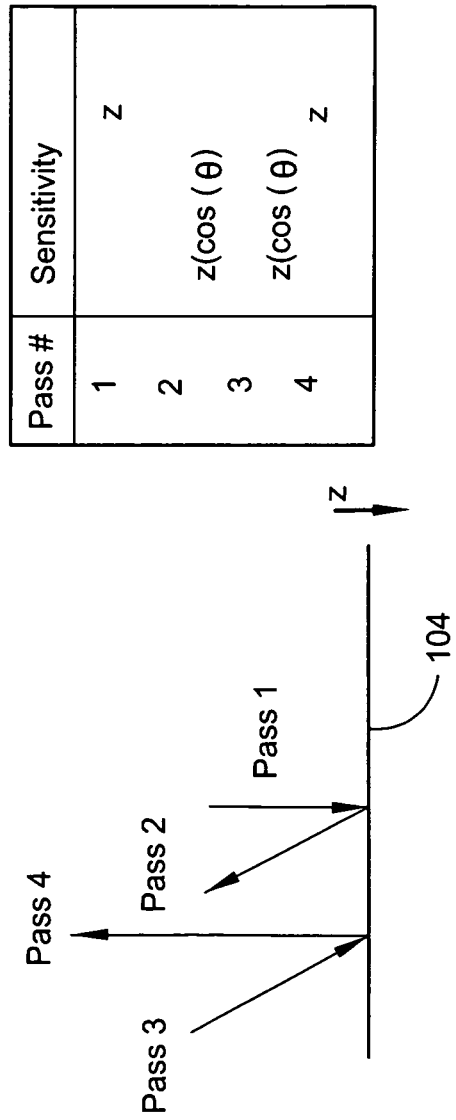

FIG. 3 shows the beams for the y measurement that originate from the same input beam shown in FIG. 1.

Recall that a heterodyne light source typically creates two slightly different wavelengths that are linearly and orthogonally polarized. Also, up to this point, there is no polarization optics in the system, so each of the output beams ((+1, +1) or (−1, −1) beams) contains both wavelengths (and polarizations). Each of these measurement beams has a large x sensitivity as described earlier, but the phase of a single beam also has a large z sensitivity. The sign of the x sensitivity of the (+1,+1) beam is opposite the sign of the (−1,−1) beam's x sensitivity, so the total x sensitivity doubles when the signals are interfered, as shown in equation 3. However, the z sensitivities of the two beams are the same sign, so the interference signal has no z sensitivity.

$$x_{interferenceSignal}=(+1,+1)-(-1,-1)=[ax+bz]-[-ax+bz]=2ax$$  Equation 3:

If one of the polarization states of the (+1,+1) beam, for example, is interfered with a reference beam that is never incident on the 2D grating 104, then there will be a z sensitivity of b. In the example of FIGS. 1-7, where the average wavelength is 632.8 nm and the grating pitch is 2 um, the value of b=2*(1/cos(18.44))÷2=4.108 (See FIG. 4). The ruler used for measuring the z position is the wavelength, so one period of the sinusoidal signal is 632.8 nm of path difference. Given the value of b, the signal goes through one period for a z change of 632.8/4.108=154.03 nm. Assuming the same electronics resolution of 1 part in 2^13, this is a resolution of 0.019 nm. Of course, the z measurement signal also has a sensitivity magnitude to x of 'a' (half that of the x signal), so the measured x value must be used to correct the z measurement. Therefore, the x measurement resolution and noise level will limit the resolution of the z measurement.

An important thing to note about the Shuriken design is that it is straightforward (and essential for thermal stability) to set the glass paths equal for the 3 interferometers. It is desirable to have equal air path for the two beams of each interferometer, and the design shown in this disclosure achieves both zero glass dead path and zero air dead path. This is the reason for the 'z reference trombone' 118 shown in FIG. 5. If the system were allowed to have an air path mismatch, it would reduces the number of fold mirrors required in the system at the cost of decreased measurement stability.

Figure 5:
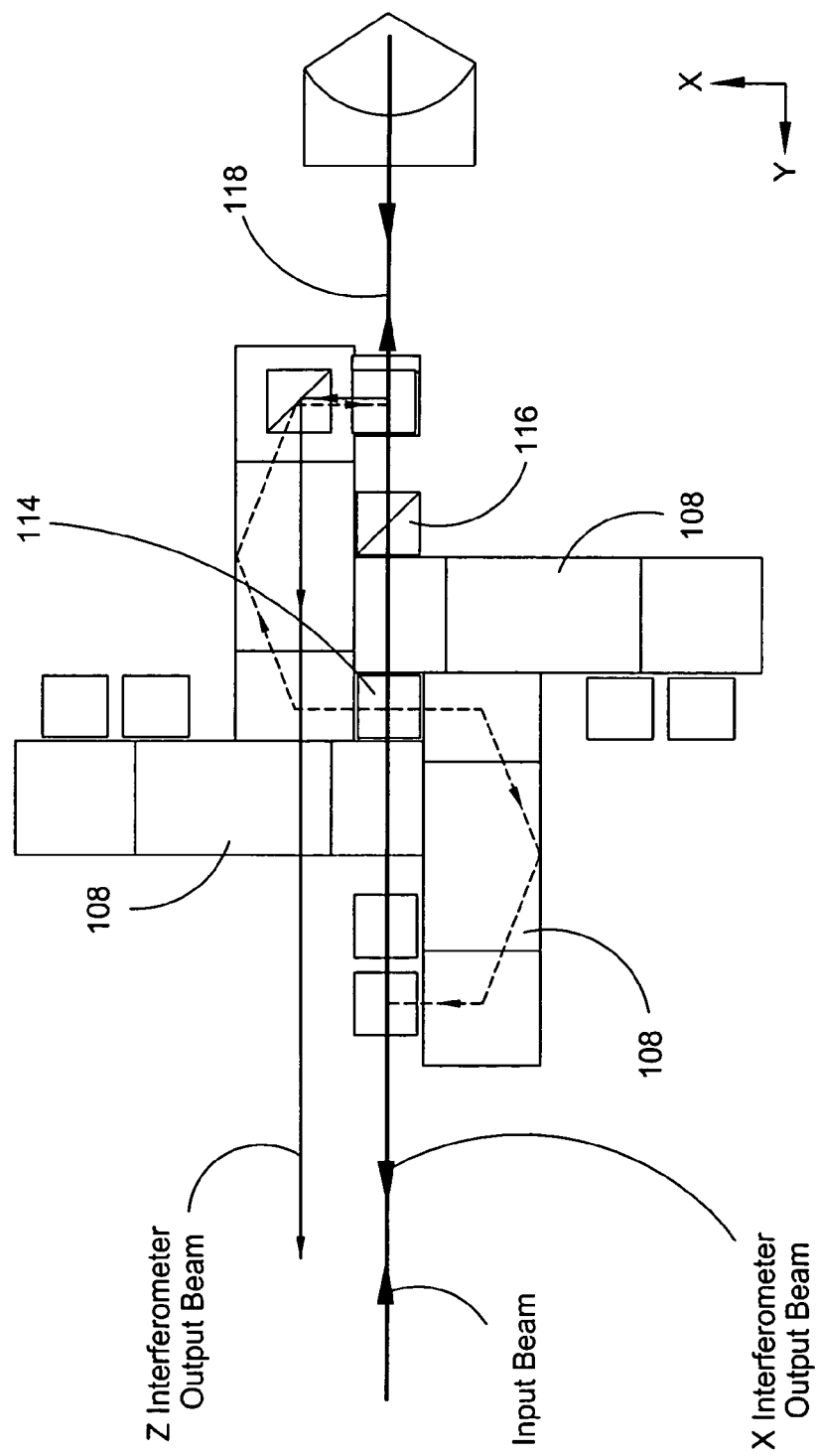
Figure 6:
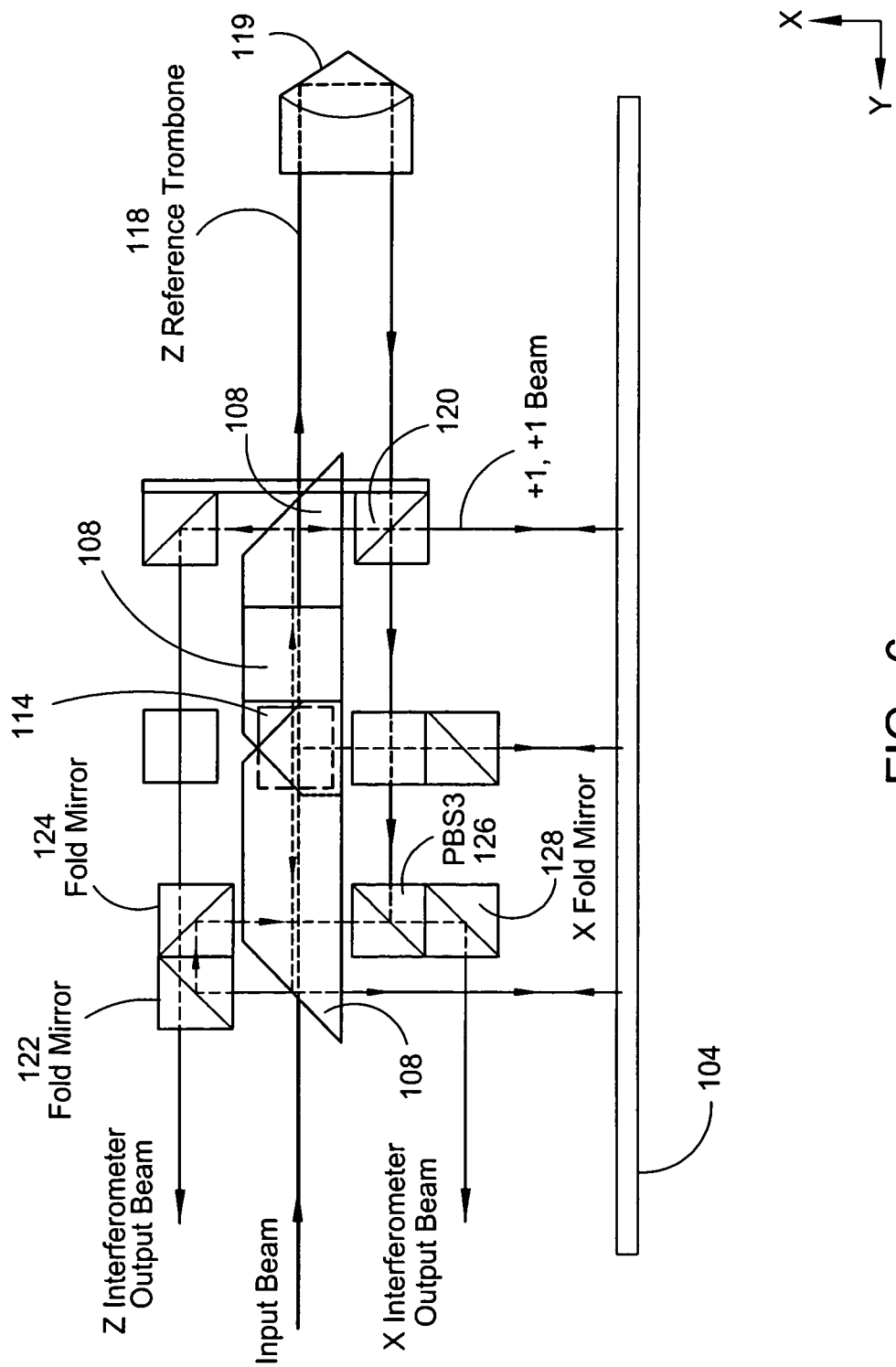
Figure 7:
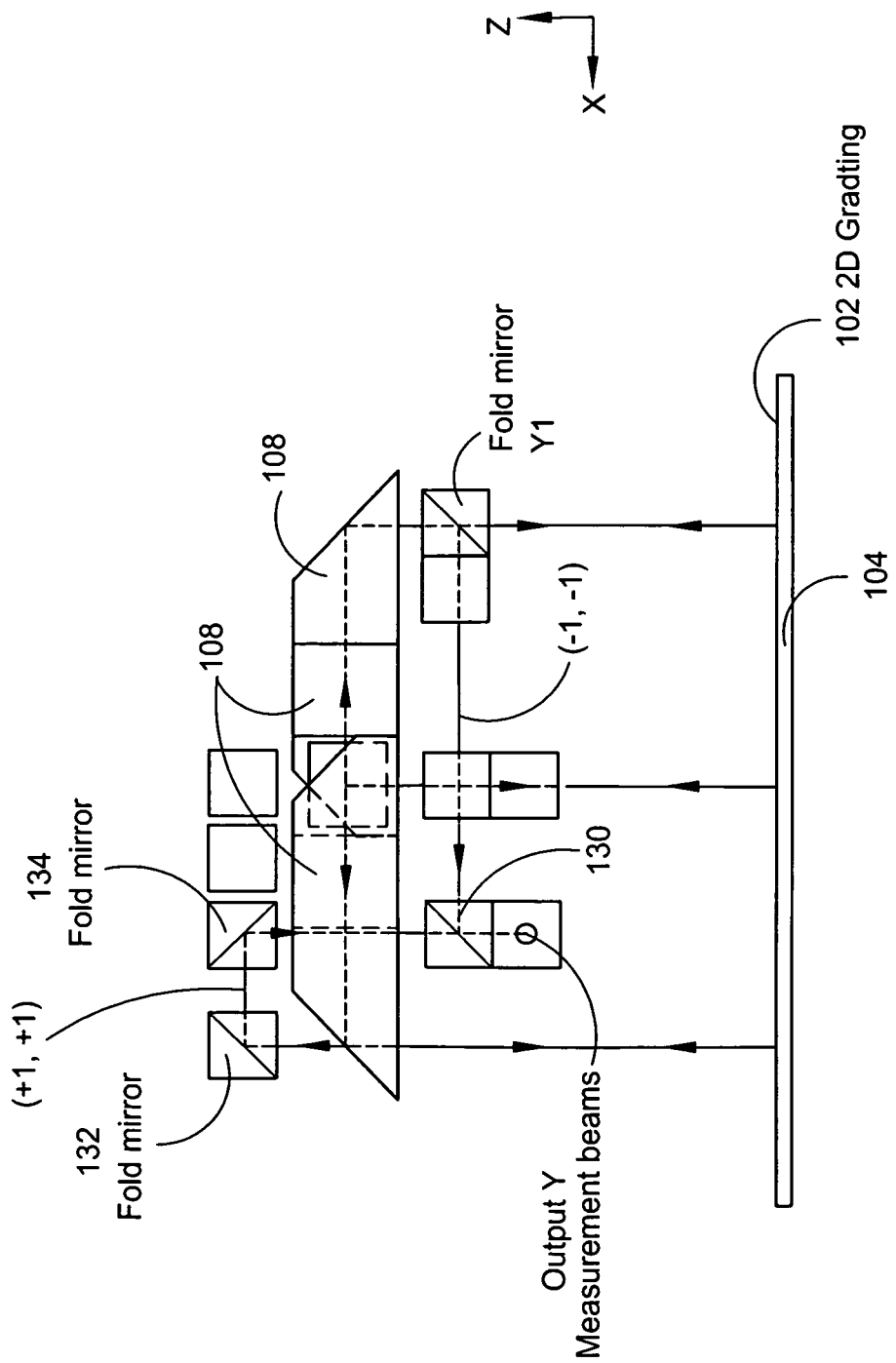

FIGS. 5-7 show the beam path for the z measurement, where additional optics (mirrors and polarization beam splitters, or PBS) have been added to complete the interferometers. The majority of the input beam is reflected down towards the grating, but a small amount is transmitted by the amplitude beamsplitter 114 (shown as green beam in exhibit A). It goes through the side of the prism retroreflector and then through a polarization beam splitter 116 (PBS1) that selects one polarization to be the reference beam. This reference light goes through a window, the thickness of which is set to equalize the glass path for the two beams of the z interferometer, the reason for which is described earlier. It then goes through the optical trombone 118 to equalize air path; this long air path can be removed if equal air path is not required. A corner cube retroreflector 119 is used in this path to ensure the two beams have equal parity, which ensures that input beam pointing will not make the two measurement beams tilt in opposite directions, reducing signal contrast.

From FIG. 6, we see the z reference beam is incident on polarization beam splitter 120 (PBS2), where it is reflected upwards. The orthogonal polarization state from the (+1,+1) beam is transmitted by PBS2, so PBS2 is the beam combiner for the z interferometer. There are two common path fold mirrors 122, 124 that send the z measurement beam out from the direction of the input beam, but displaced in x.

FIG. 6 also shows the completion of the x interferometer. The opposite polarization state of the (+1,+1) beam is reflected by the PBS2 and sent over to be combined with the (−1,−1) beam by polarization beam splitter 126 (PBS3). It should be noted that no waveplates are required for this system. There is a fold mirror 128 that sends the x interferometer signal out the same direction as the input beam. Meanwhile, the (−1,−1) beam goes up to the two (−1,−1) fold mirrors 122, 124 to ensure equal glass and air path for the x interferometer.

PBS2 120 is important, since it combines the z beams and sends the x (+1,+1) beam in the proper direction. If there is any transmission of the z reference beam, it is orthogonally polarized compared to the (+1,+1) x beam. Because of this, the unwanted light will be transmitted by PBS3 126, and therefore will not contaminate the x interferometer signal.

FIG. 7 shows the y interferometer optics, which are very similar to the x measurement in the use of fold mirrors to create equal glass and air paths, making the system have very low thermal sensitivity and low sensitivity to frequency drift of the light source, which can be a problem for traditional heterodyne stage position measurement systems (i.e., DMIs). Polarization beam splitter 130 (PBS4) transmits the (+1,+1) beam and reflects the (−1,−1) beam, and then both are sent out to the detection system by fold mirror. Two fold mirrors (132, 134) are used to match the glass and air paths for the two beams of the y interferometer.

All of the output measurement beams have orthogonal polarizations, so a polarizer is required prior to the detector to make them interfere. This polarizer will remove, on average, half the light from each beam.

Another important aspect of the Shuriken concept is that a retroreflector 108 can instead of glass be made as an "air retroreflectors" which is formed by a pair of corner prisms 110 and a reflector (mirror) extending between the prisms 110. The mirror that extends between the prisms effectively forms the portion 112. Forming the retroreflectors as air retroreflectors reduces the total glass path of the system. This removes the two refractions, which may cause problems for the polarization of the incoming light. Alternatively, small prisms could be added to the bottom of the retroreflectors such that the light is normally incident to the glass, removing the potential polarization issue of the non-normal interface. This has the additional advantage of increasing the angle of the beam inside the retroreflector, therefore shrinking the required length of the dove prism shaped retroreflector. This also reduces the beam footprint on the 2D encoder grating, which is helpful from an overall system point of view.

All of the components in the system are oriented along the x, y and z axes, making the assembly straightforward. The fact that all the glass members that form the encoder head 106 will be attached to each other ensures a higher level of thermal uniformity, and therefore reduced thermal errors.

Thus, the encoder head design according to the Shuriken concept allows the measurement of x, y and z from a single beam incident on a 2D encoder grating, by producing interfering measurement beams in both dimensions of the 2D grating. For a given range of relatively coarse pitches, this design allows high sensitivity x, y and z sensitivities with an optical design with equal glass and air paths for all 3 interferometers. In addition, each measurement beam is incident on the 2D encoder grating twice, while going through a novel retroreflector that fits in the required package and prevents the beam from hitting an edge inside a retroreflector. This allows the system to measure without any fringes (reduced contrast) in the interferometer signal when the 2D encoder grating tilts relative to the encoder read head. The resolution in x and y is about 0.06 nm while the resolution in z is about 0.06 nm as well. Finally, all the measurements are made using a single input beam, in a way that approaches the limit of light efficiency.

Additional Comments Regarding Shuriken Concept a. Basically, the Shuriken concept, shown and described in FIGS. 1-7, provides the same basic features as the Littrow embodiment of the provisional application, but in the Shuriken, there is no 2D grating on the encoder head. Rather, the Shuriken uses an assembly of optics on the encoder head to read the beams diffracted by the 2D grating on the stage.

b. With the Shuriken concept, the following features are preferred; (i) a relatively large pitch on the grating (e.g. on the order of about 1-2 microns), and (ii) a single beam that is about 99% reflected toward the grating (by beam splitting optics). A configuration that produces 8 first order diffracted beams by the 2D grating, 4 of which are directed to the retroreflectors, so that measurement beams hit the grating twice, and the interferometer contrast is insensitive to tilt.

c. Measurement of x, y position is relatively similar to that of the Littrow (of the provisional application), and measurement of z uses the same beam as the x measurement, and also the approximately 1% that passes through the beam splitter as a z reference (1 polarization) along with the z reference trombone back to the polarization beam splitter. The x beam (polarized) is split and becomes the measurement beam for the z direction. The encoder of the Shuriken provides 4 passes, and produces a relatively high sensitivity.

Gamma Embodiment FIGS. 8-28

The Gamma concept, described further below, further develops the encoder head in a manner that is designed to further improve light efficiency while meeting all of the objectives described herein.

In its basic aspects, The "Gamma Encoder" concept uses four retroreflectors to produce 4× sensitivity interference signals for X and Y, while using the grating 104 as a beam combiner to produce optimal power efficiency. In addition, the Gamma encoder concept uses polarization optics to isolate the X/Y signals from $\{+1,0,0,+1\}$ and $\{-1,0,0,-1\}$ beams, which would otherwise contaminate the signal leading to large cyclic errors due to coherent stray light. Furthermore, a slight modification to the Gamma concept enables measurement of z without additional beams, and very little additional complexity.

The Gamma concept currently has several implementations, three of which, the Solid Gamma (FIGS. 8-10) the Air Gamma (FIG. 11) and the In Line Gamma (FIGS. 16-23) are shown and described below, and the operating principles of the Gamma versions are described and shown in FIGS. 12-15 and 24-28 below. Other features of the Gamma are also shown and described in the provisional application.

Figure 8:
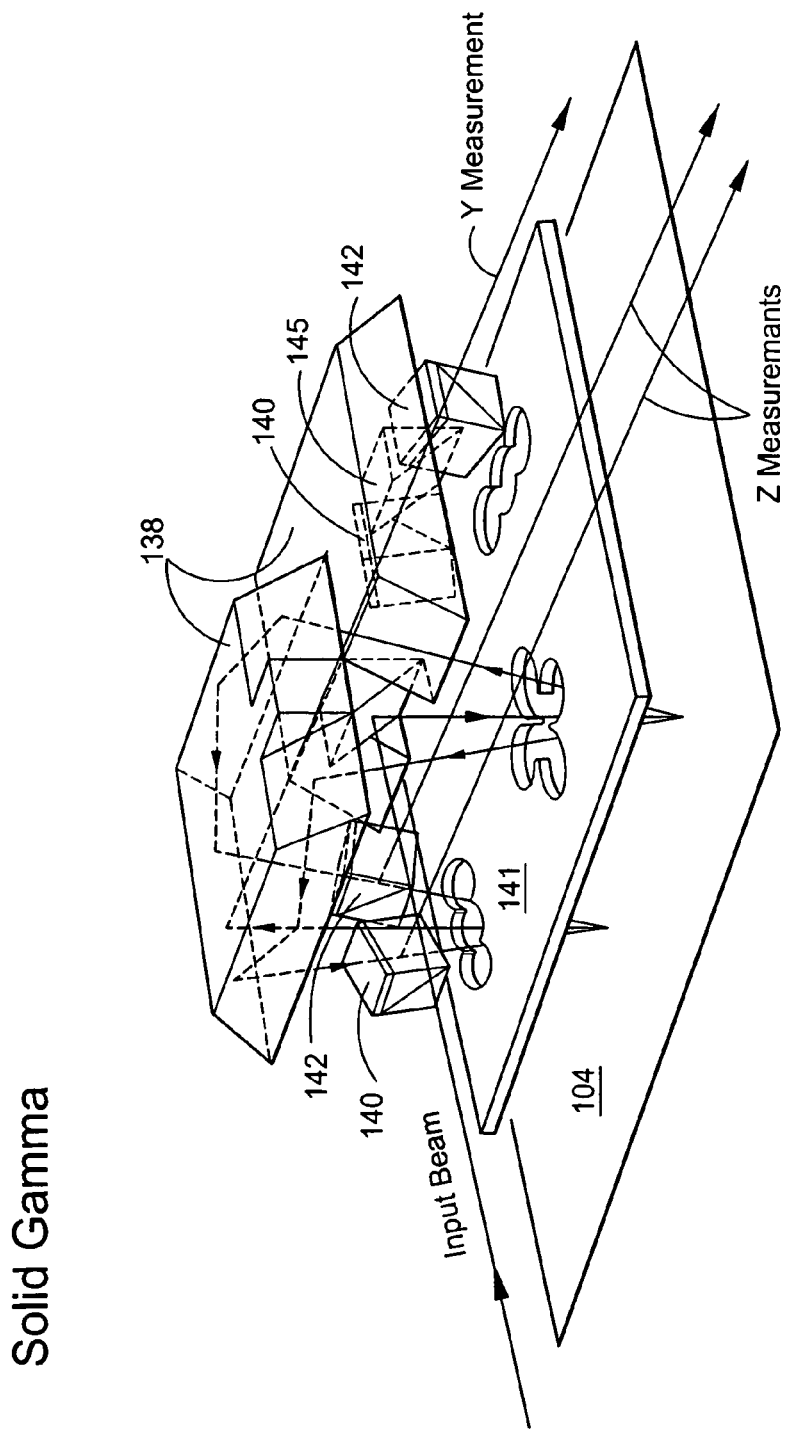
Figure 9:
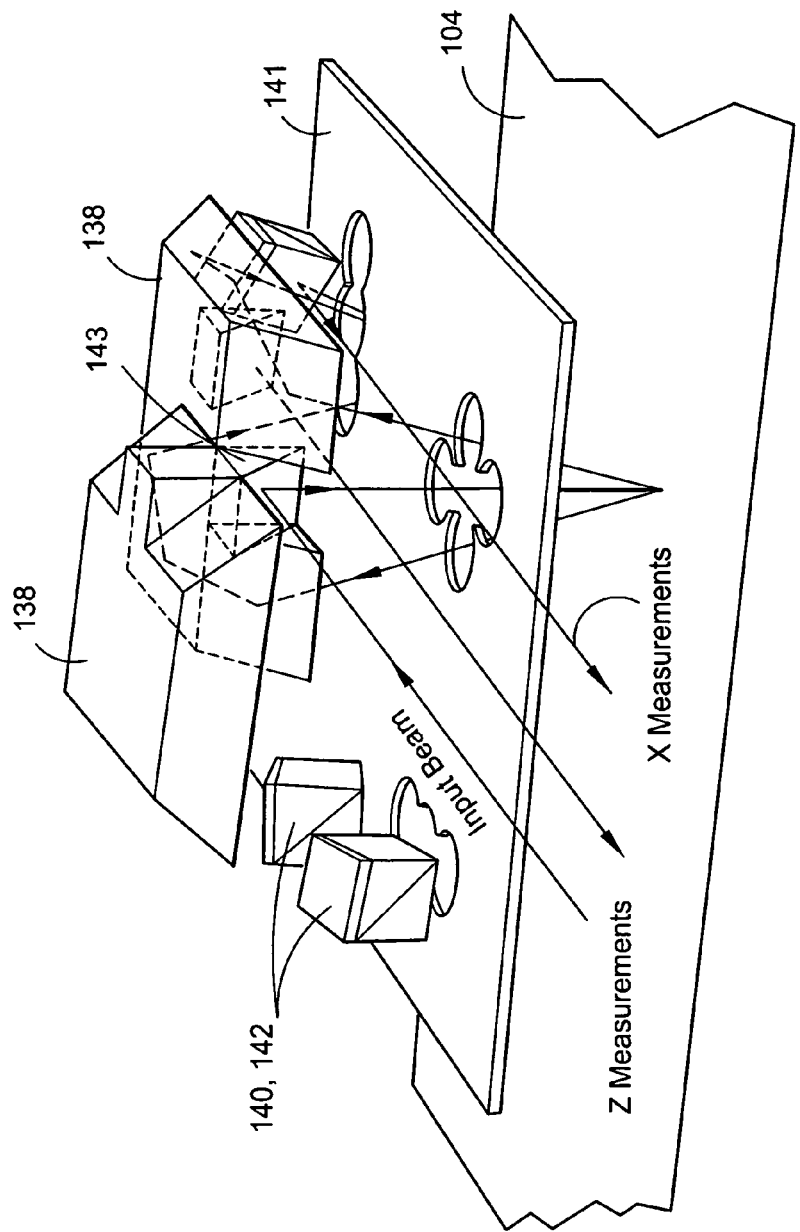
Figure 10:
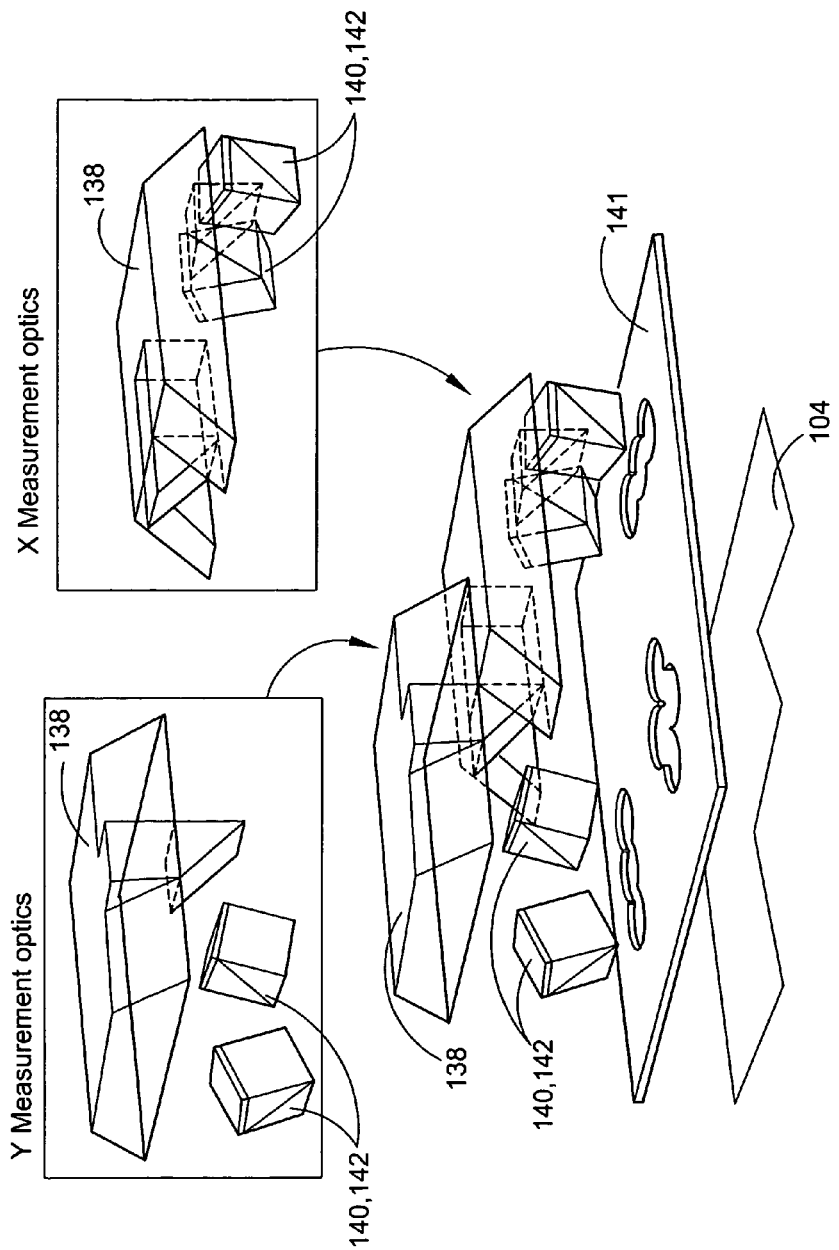

The Solid Gamma Concept is shown and described in FIGS. 8-10, and is designed to provide the features shown and described in connection with the Shuriken, with an encoder head that has two solid retroreflectors 138 (replacing the two pairs of dove-shaped retroreflectors 108 of the Shuriken). The Solid Gamma also provides polarization isolation, to remove stray light. Specifically, the Solid Gamma includes two polarization beam splitters 140, one of which has a half wave plate 142, and the Solid Gamma also includes an aperture plate 141, to produce polarization isolation and remove stray light. Also, the Solid Gamma includes input fold mirrors 143 (FIG. 9) and a fold mirror 145 (FIG. 8) for the diffracted measurement beams.

The manner in which the gamma version (e.g. the Solid Gamma) handles the light beam(s), is shown in FIGS. 12-15.

Figure 12:
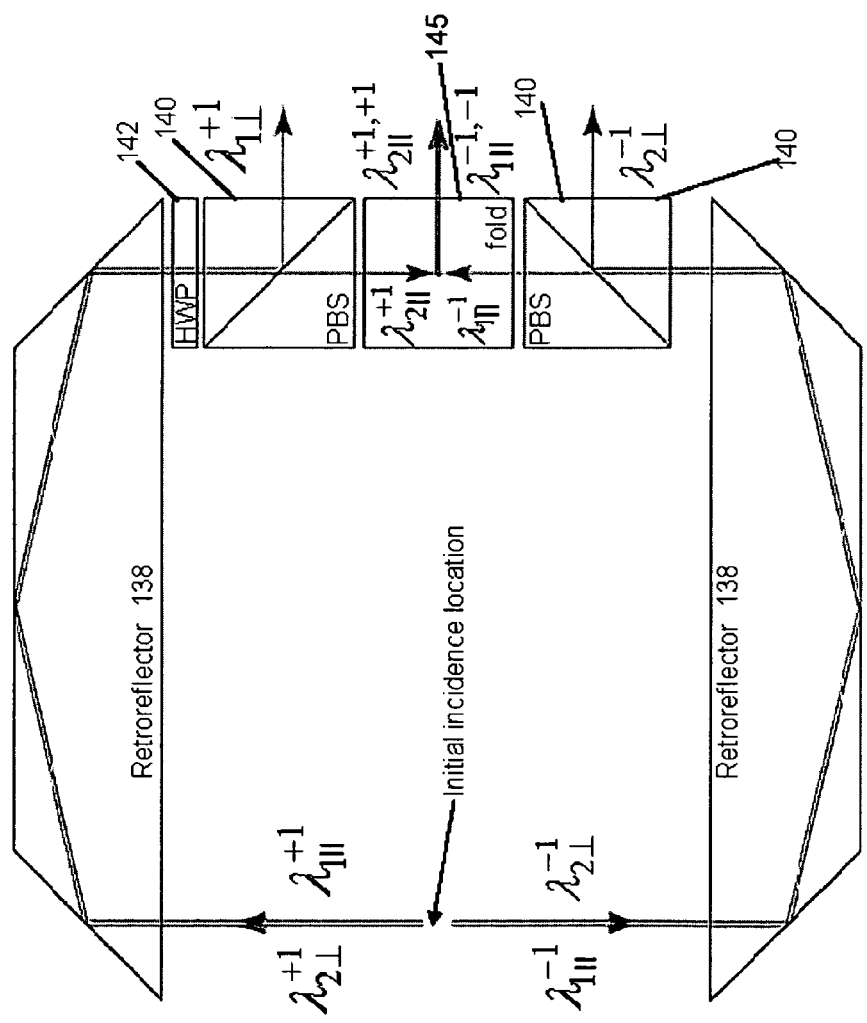

FIG. 12 shows the beam path taken after the first diffraction. Both wavelengths are diffracted into +1 and −1 orders and pass through the top and bottom retroreflectors 138 respectively. After the +1 order passes through the top retroreflector 138, it passes through a HWP 142 at 45°, and then a PBS 140. This PBS 140 passes the second wavelength, and reflects the first. After the −1 order passes through the bottom retroreflector 138, it does not encounter a HWP, and so the PBS 140 passes the first wavelength and reflects the second. The grating 104 then diffracts a $\{+1,+1\}$ beam at the second wavelength and a $\{-1,-1\}$ beam at the first wavelength. Since they have the same polarization, they will interfere without an additional polarizer, but we see the top view of the fold mirror 145 that extracts the beams to send to the detector. However, the grating 104 also produces $\{+1,0\}$ and $\{-1,0\}$ beams into the opposing PBS 140.

Figure 13:
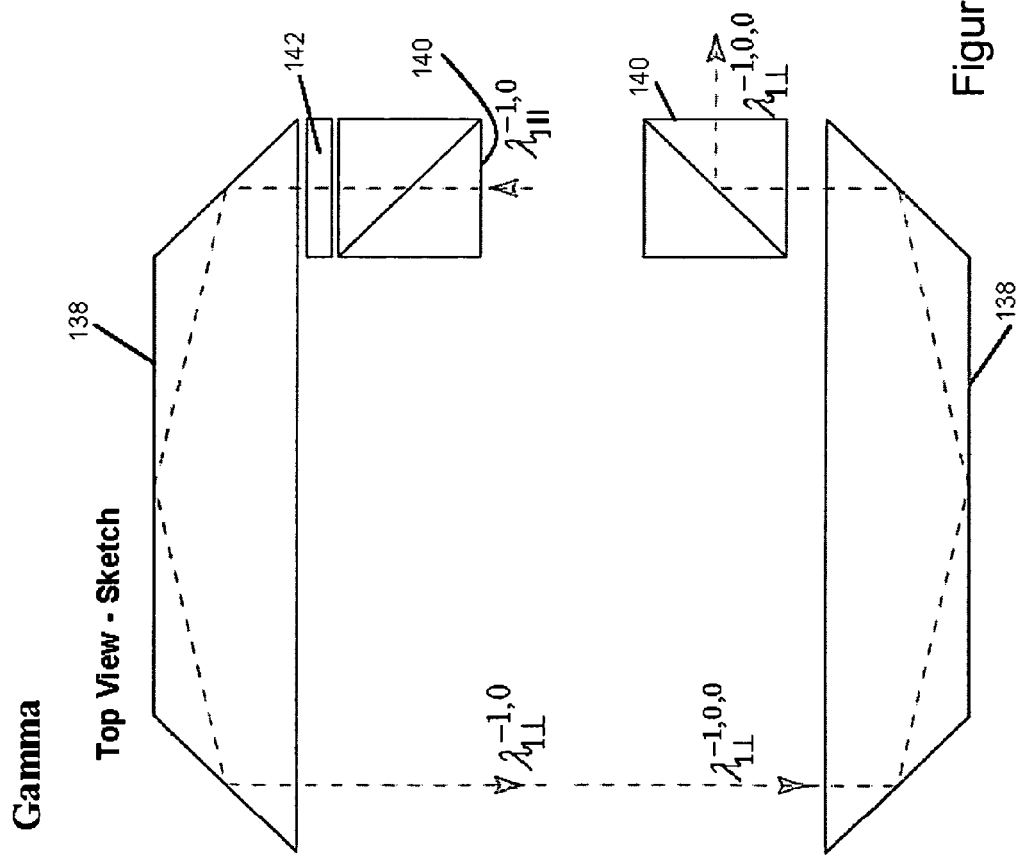

FIG. 13 illustrates the path taken by the 0-order diffraction of the first wavelength on the second pass through the grating. Immediately after leaving the grating, the $\{-1,0\}$ first wavelength beam passes through a PBS 140 and it's polarization is flipped by the HWP 142. It then travels through the top retroreflector 138 and is sent back to the grating, where a second 0-order diffraction sends this wavelength to the bottom retroreflector 138, after which it is reflected by a PBS 140. In this way, the $\{-1,0\}$ diffraction is completely removed from the system.

Figure 14:
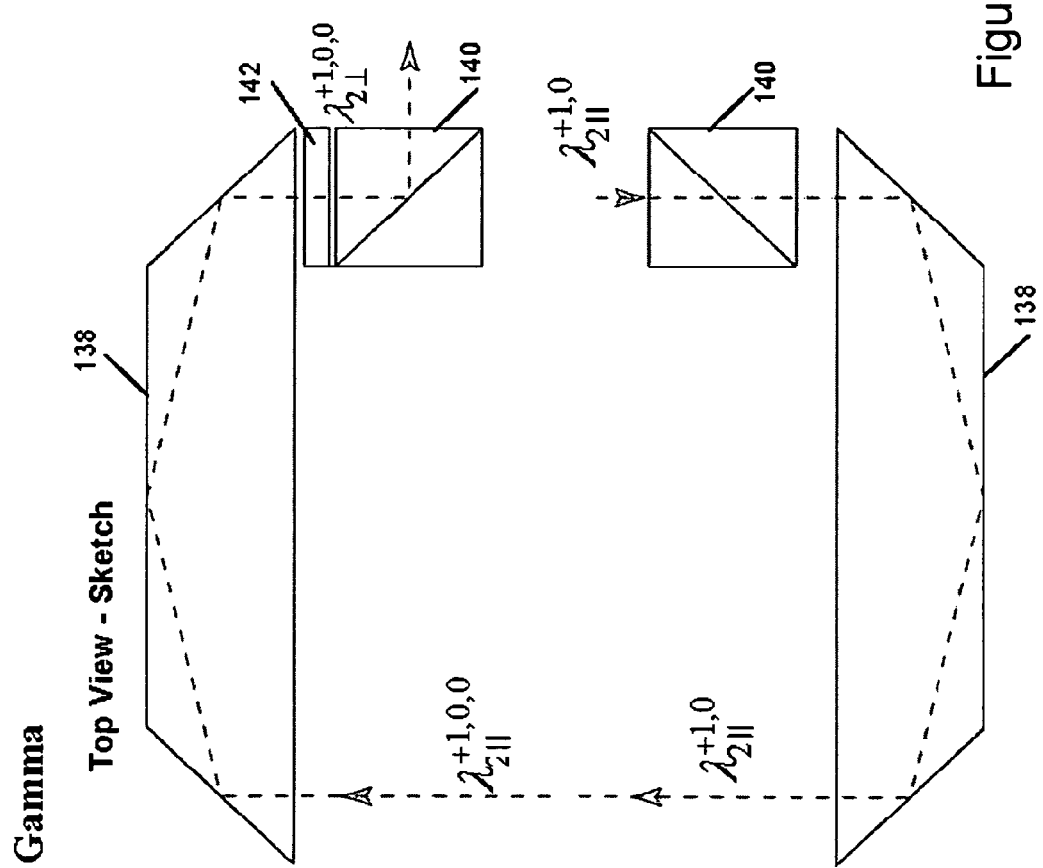

FIG. 14 illustrates the path taken by the 0-order diffraction of the second wavelength on the second pass through the grating. Immediately after leaving the grating, the $\{+1,0\}$ second wavelength beam passes through a PBS 140 unchanged. It then travels through the bottom retroreflector 138 and is sent back to the grating, where a second 0-order diffraction sends this wavelength to the top retroreflector 138, after which it encounters a HWP 142 and is then reflected by a PBS 140. In this way, the $\{+1,0\}$ diffraction is completely removed from the system.

Figure 15:
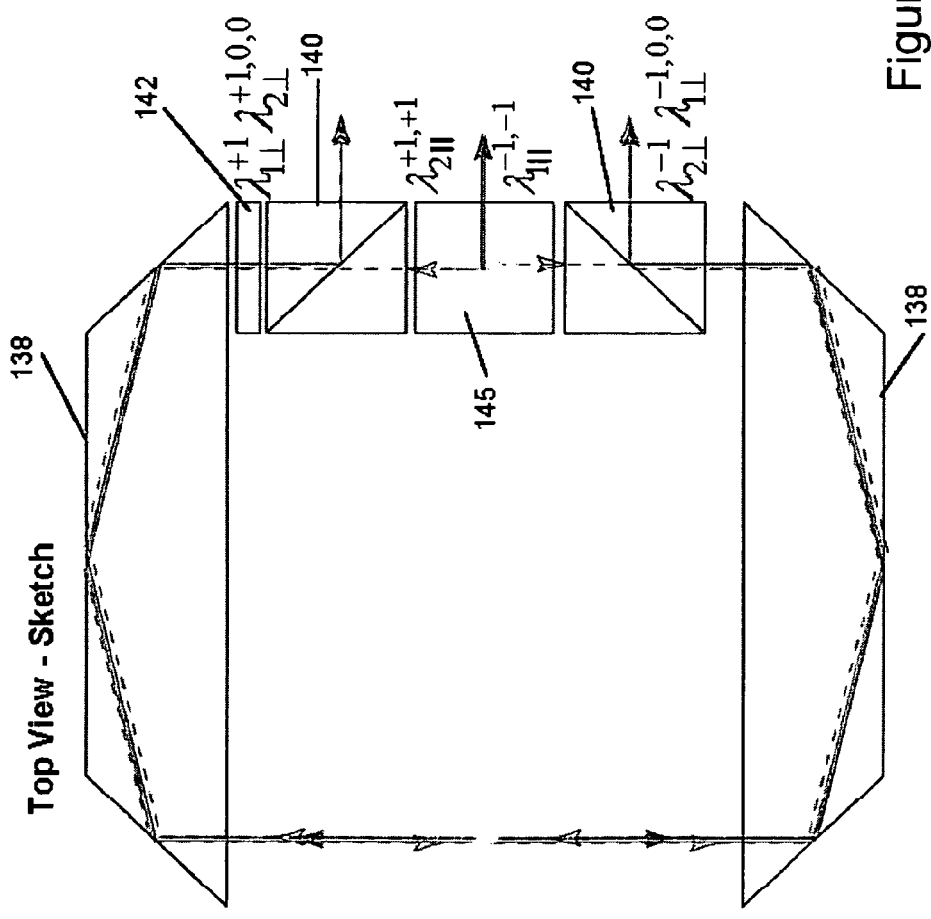
Figure 16:
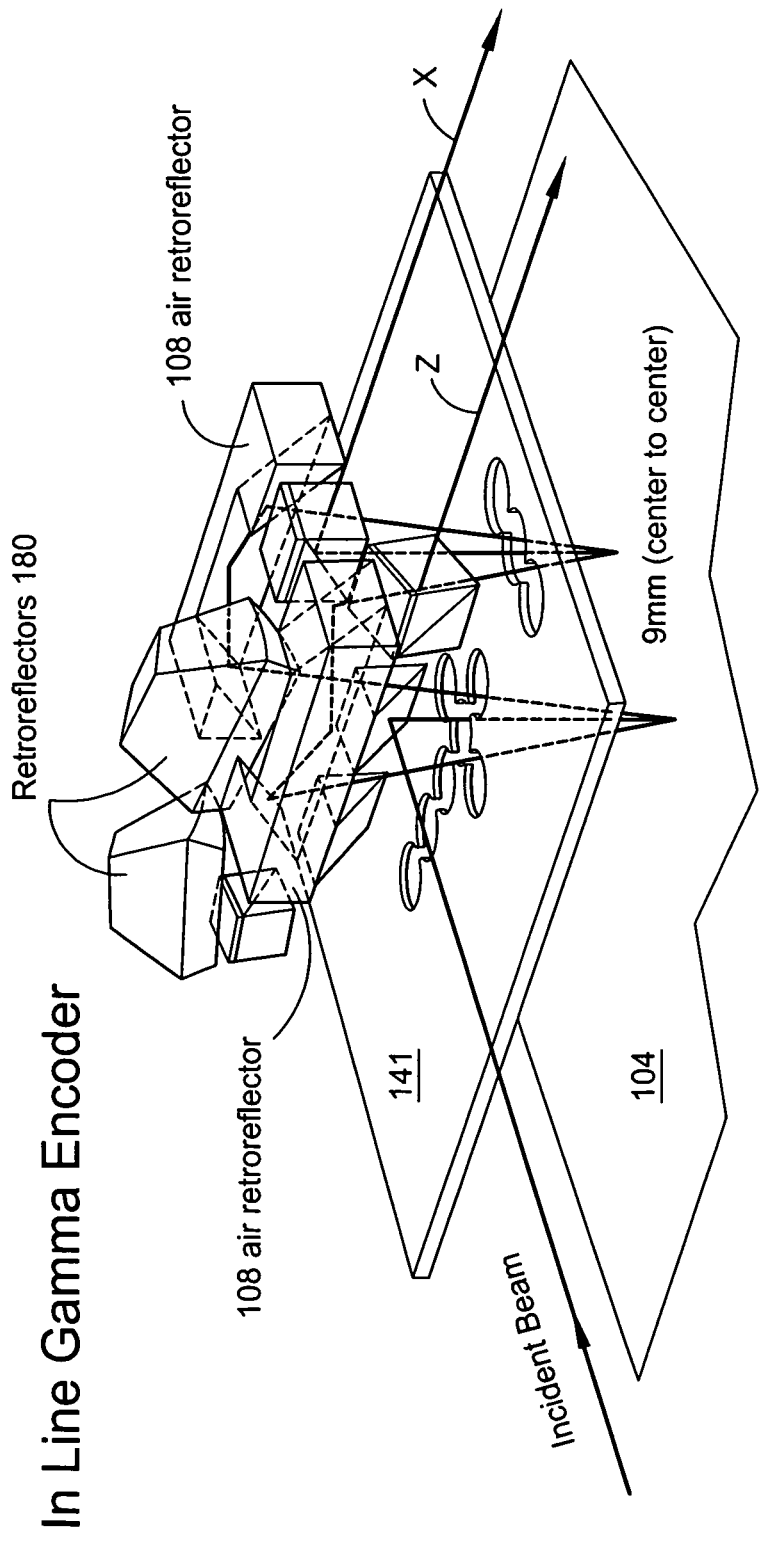
Figure 17:
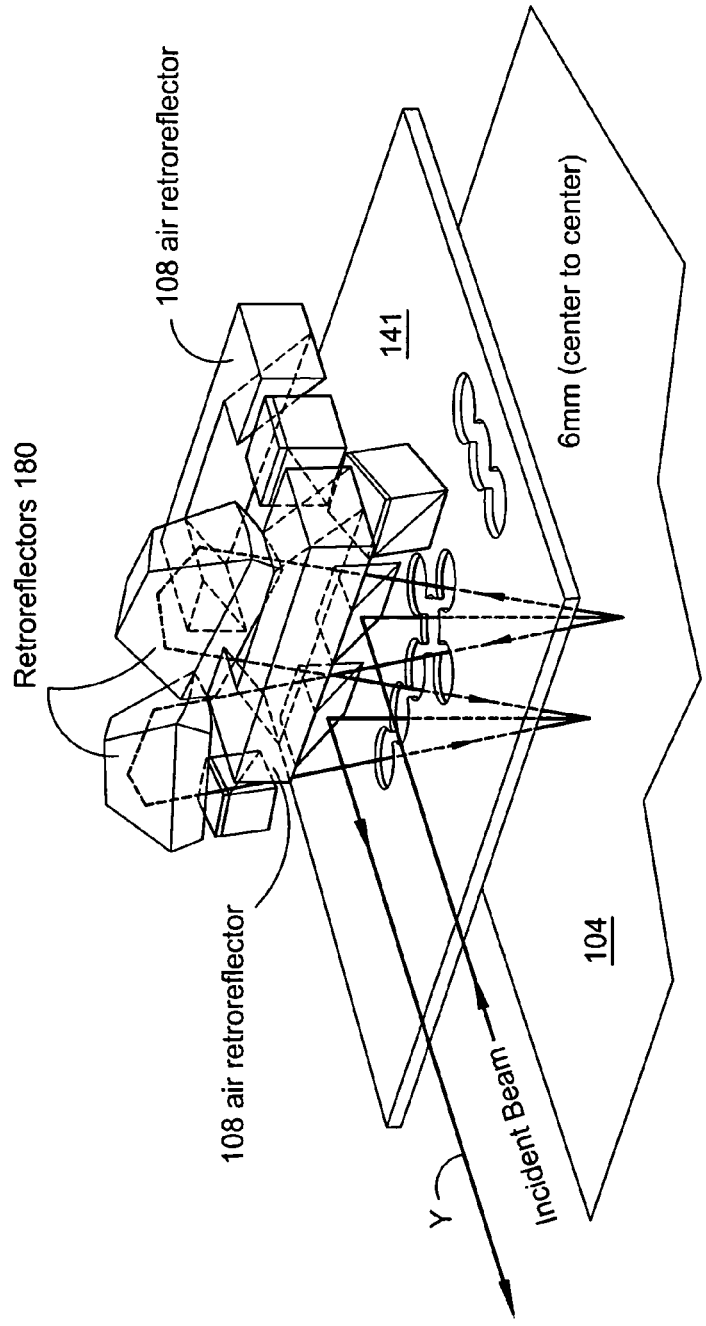
Figure 18:
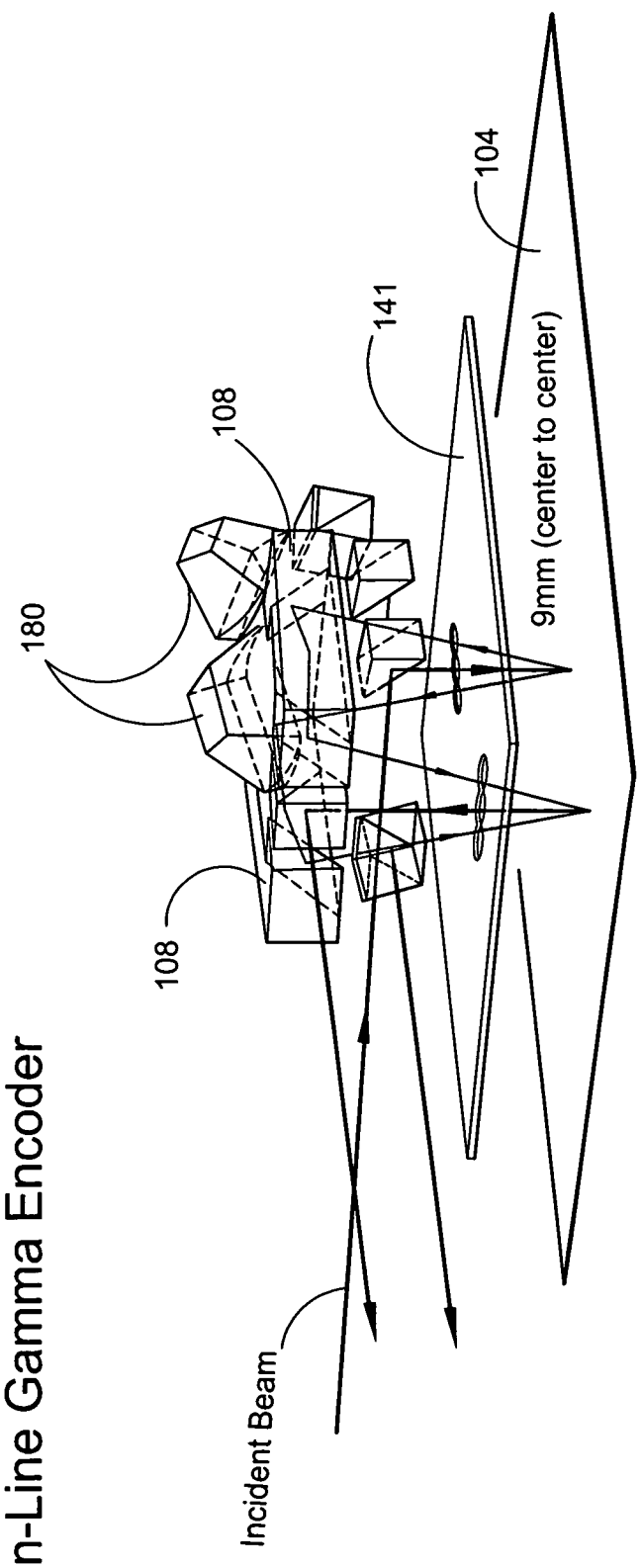
Figure 19:
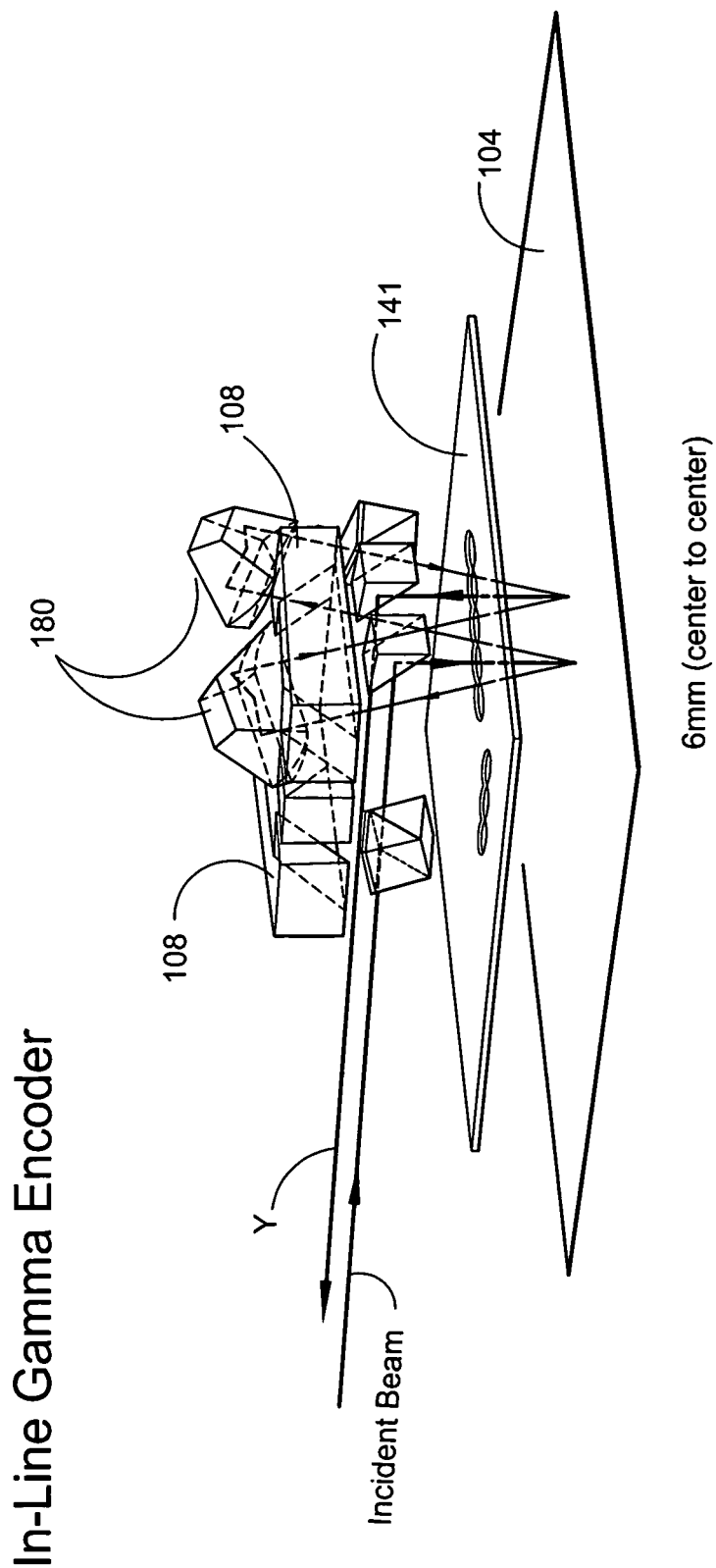
Figure 20:
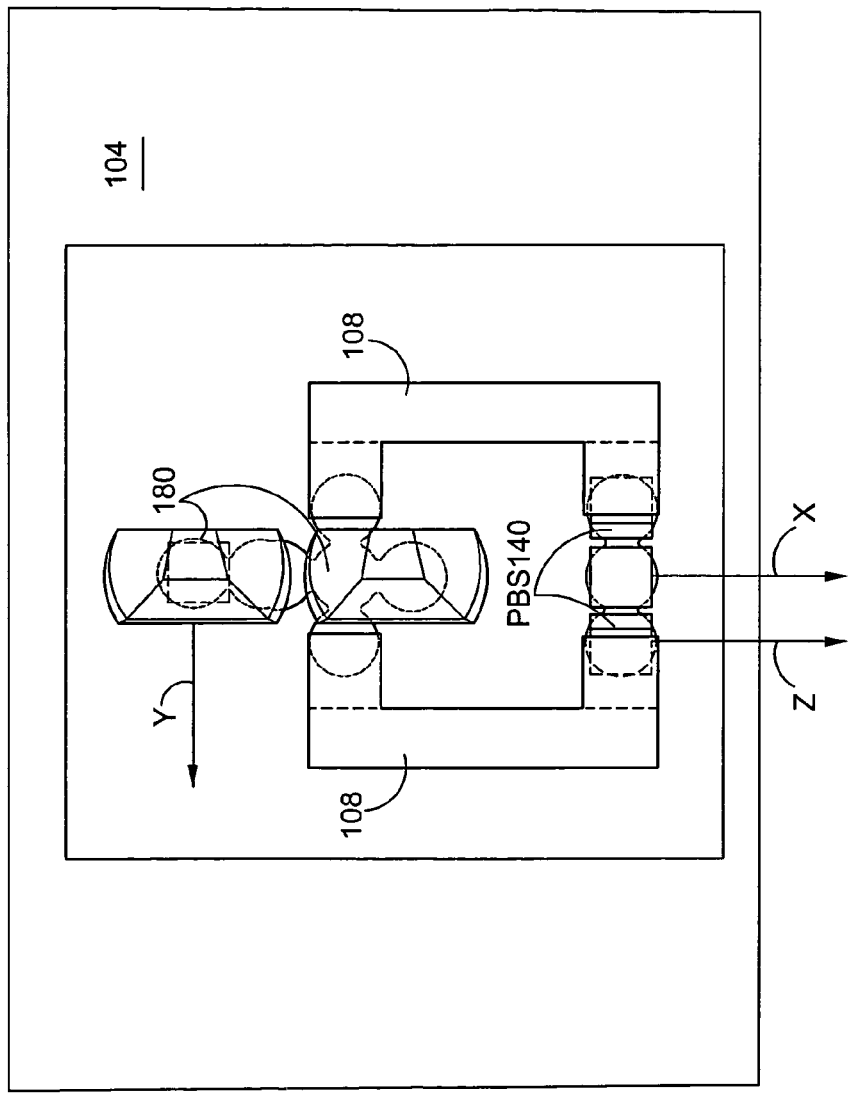
Figure 21:
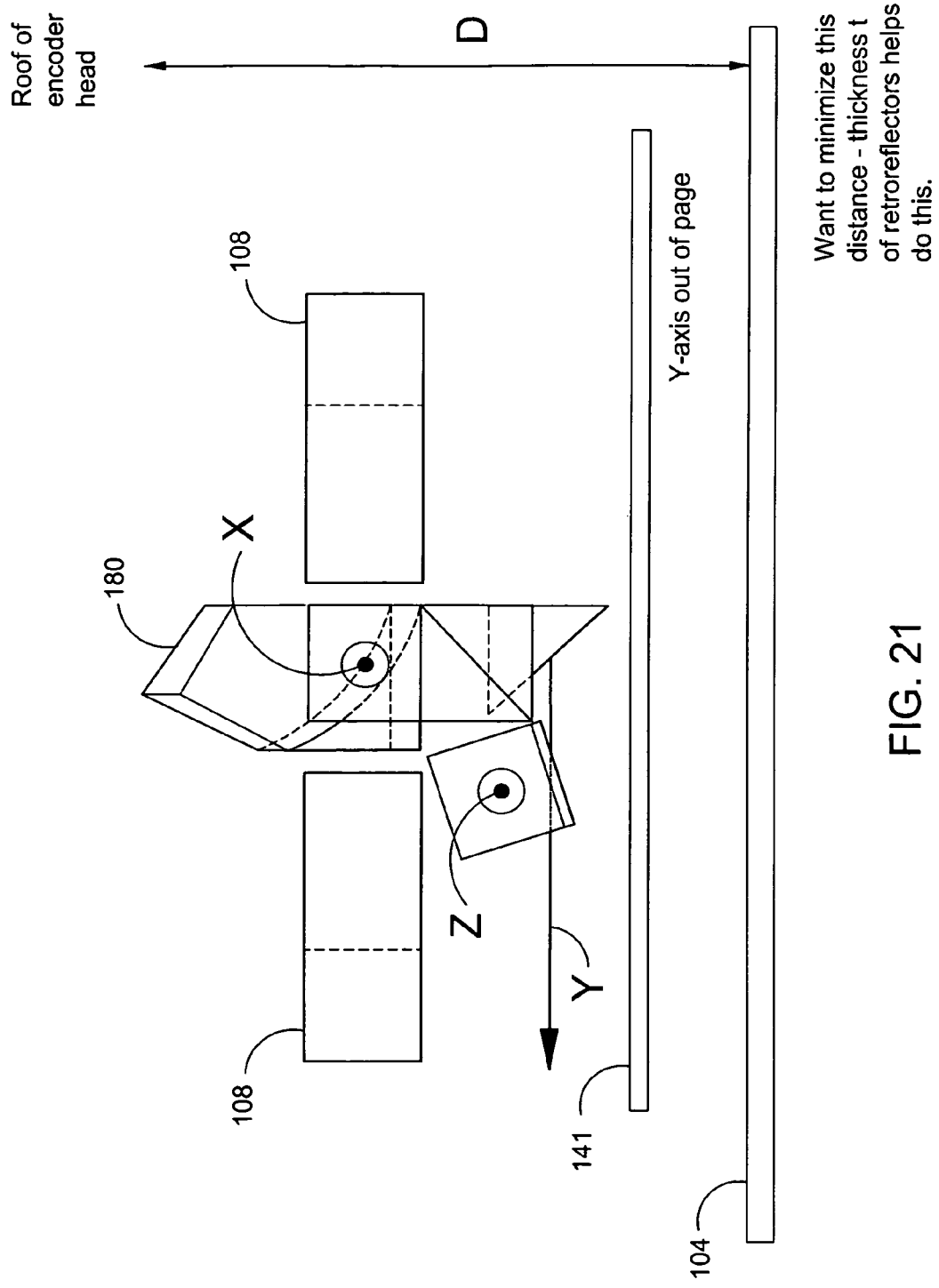
Figure 22:
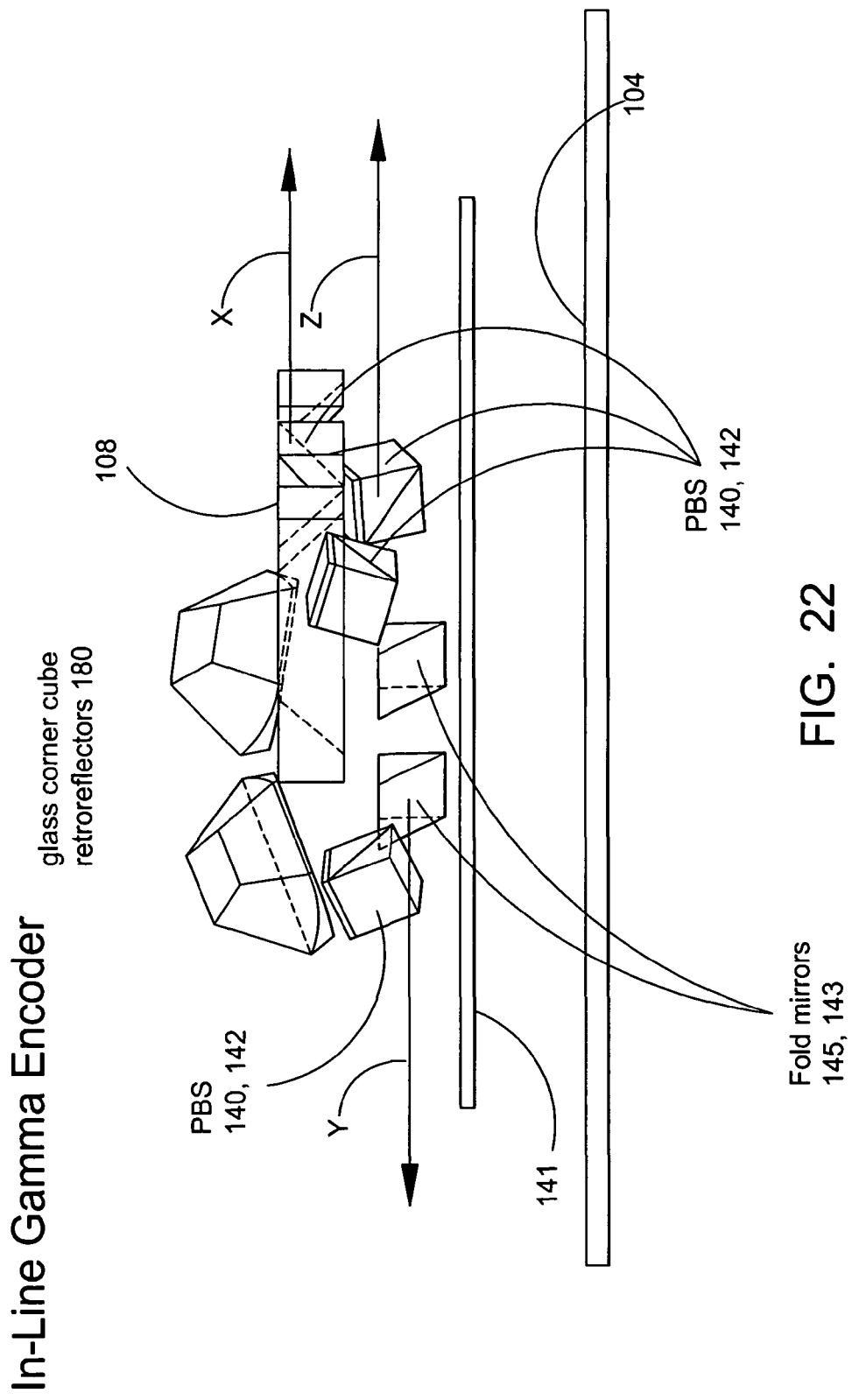
Figure 23:
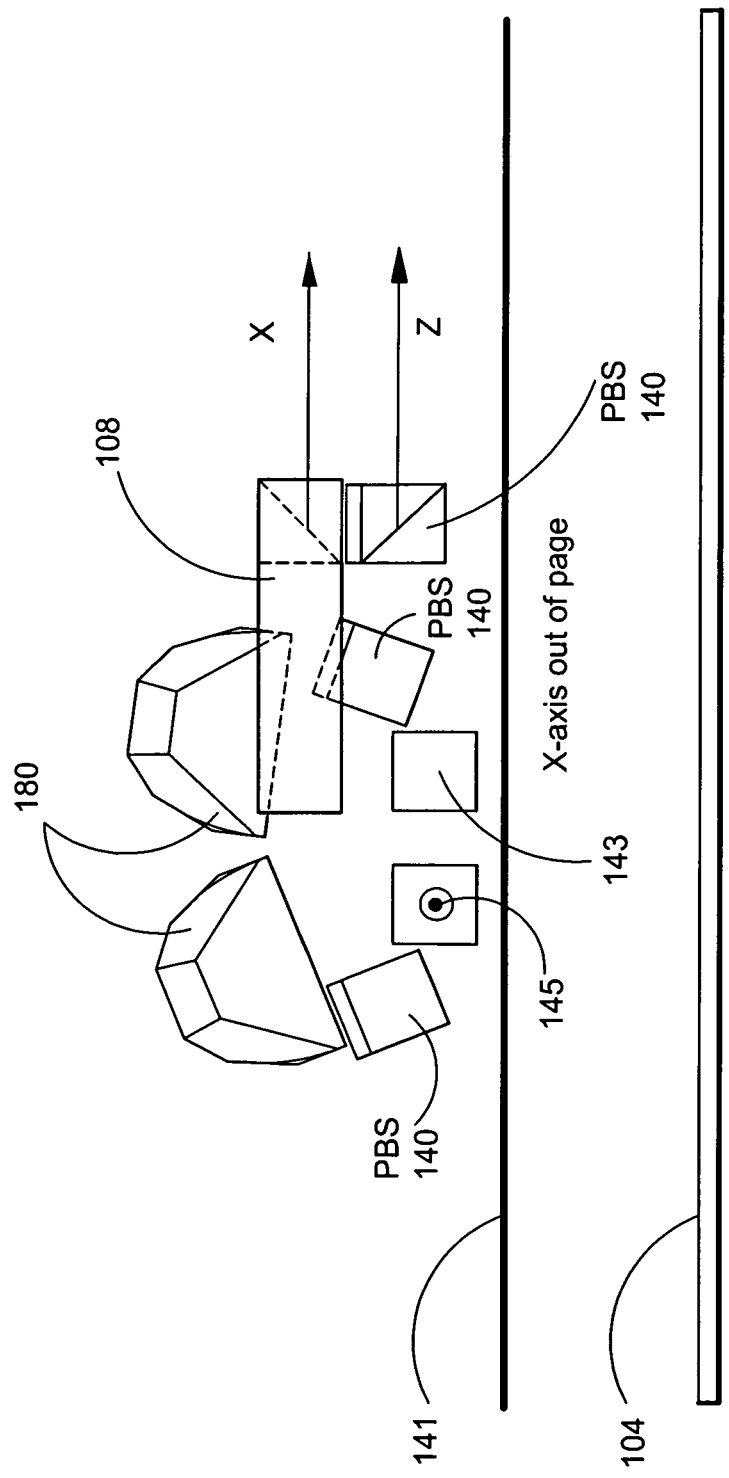

FIG. 15 shows all beam paths together, showing that the (+1,+1) and $\{-1,-1\}$ beams are uncontaminated by the 0-order diffractions. It also shows that the $\{+1\}$ and $\{+1,0,0\}$ beams interfere, and that the same is true for the $\{-1\}$ and $\{-1,0,0\}$ beams. Both of these interference signals are insensitive to the lateral position of the grating, but do produce a double pass sensitivity z-signal (applicants note that this z measurement does not have equal air and glass paths for the two measurement beams). When combined with another pair of retroreflectors to pick up the orthogonal +1,−1 diffraction orders, this system will produce X, Y, and four Z signals. Moreover, the system will produce the interfering measurement beams in both dimensions of the 2D grating.

Figure 11:
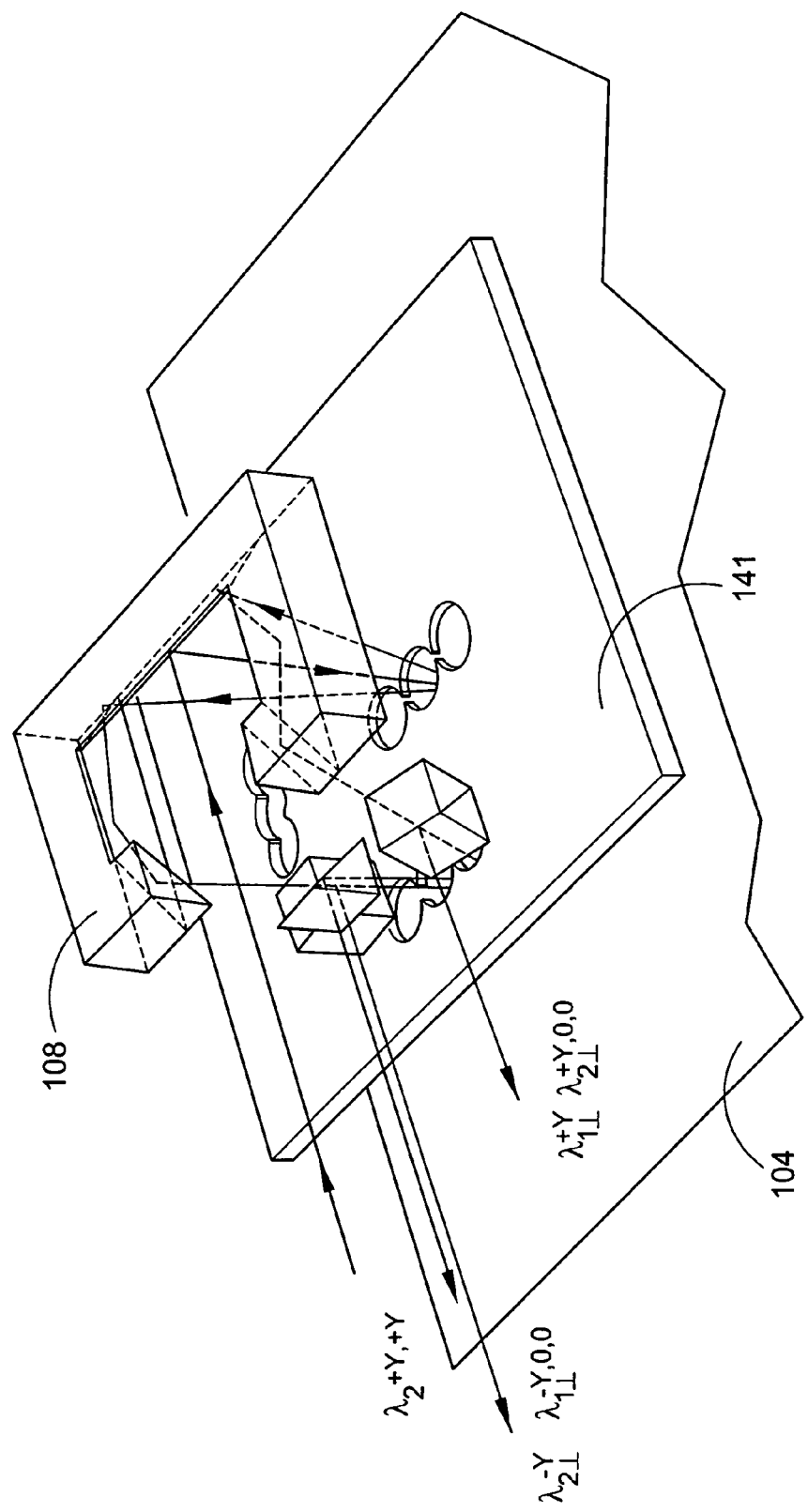

The Air Gamma is schematically illustrated in FIG. 11. It is similar to the Solid Gamma, but in the Air Gamma a pair of air retroreflectors 108 are used in place of each of the solid retroreflectors 138 of the Solid Gamma. The beam paths are generally according to the principles described herein in connection with the Solid Gamma.

The In Line Gamma has an encoder head 160 designed to control beam paths according to the general principles of the gamma described herein, but the In Line Gamma is reconfigured to provide an encoder head and grating configured such that the measurement beam incidence locations lay substantially along a single line (FIG. 31), providing the system with a relatively narrow beam footprint on the grating 104. More specifically, as shown in FIGS. 16-23, the In Line Gamma comprises an encoder head formed of several glass members that are connected together to effectively form a single integrally formed optical component. Those glass members include a pair of corner cube retroreflectors 180 (that are of conventional design), a pair of air retroreflectors 108 of the type disclosed in connection with the Shuriken and Gamma concepts, polarization beam splitters PBS 140 and half wave plates 142 on certain PBS, fold mirrors 143, 145 that are similar to the Solid Gamma, an aperture plate 141 similar to the aperture plate of the Solid Gamma, and quarter wave plates 166 associated with certain of the PBS 140.

In the In Line Gamma version, orientation of the retroreflectors 108 are rearranged, and combined with the corner cube retroreflectors 180, to provide a more linear orientation, as opposed to the transverse orientations of the Shuriken and the other Gamma versions. This reorientation enables the measurement beam incident locations to be in a single line (FIG. 31), thereby reducing the footprint of the encoder system.

Figure 30:
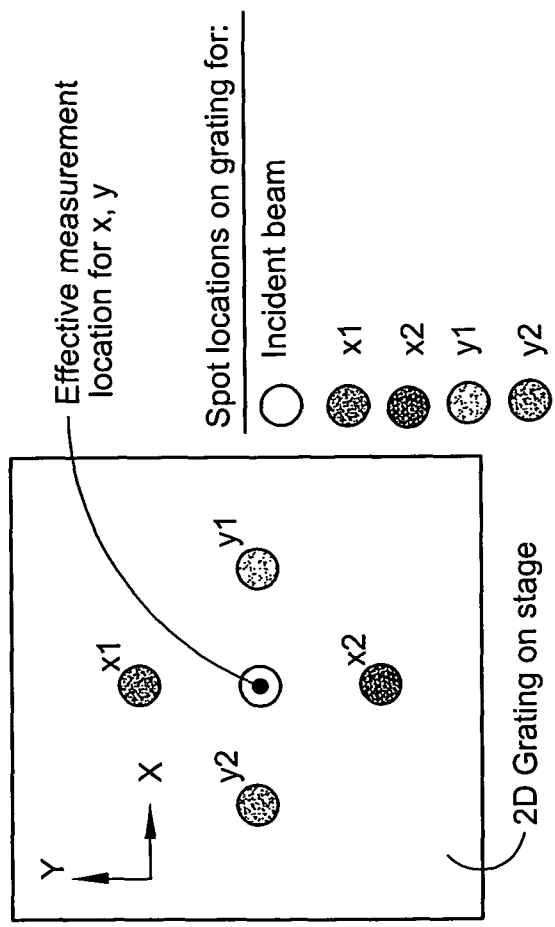
FIG. 30 shows the beam footprint for the Shuriken version of FIGS. 1-7.
Figure 32:
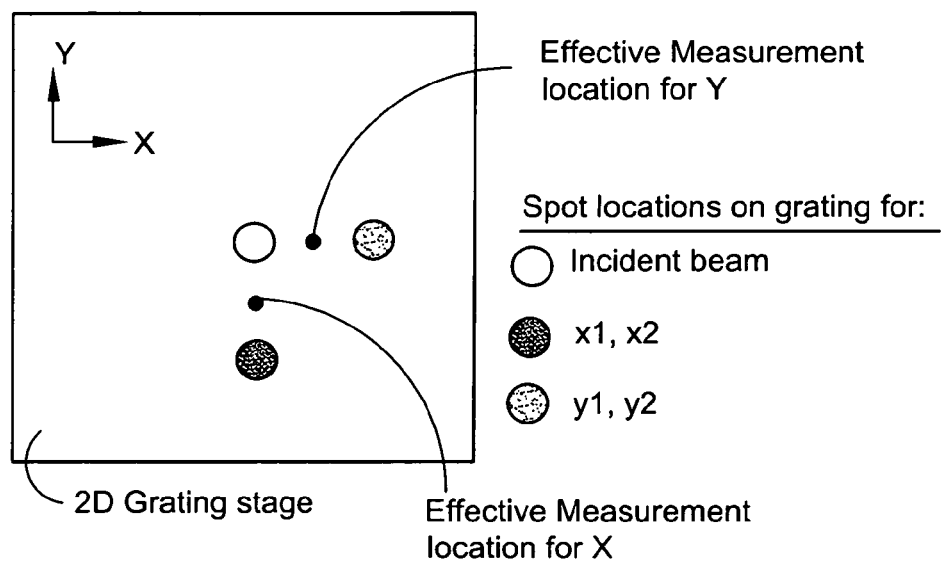
FIG. 32 shows the beam footprint for the gamma versions of FIGS. 8-11.

FIG. 30 shows the beam footprint for the Shuriken concept, and FIG. 32 shows the beam footprint for the solid and Air Gamma versions described above. The incident beam is at the center, and it is the first pass off the grating for all 4 measurement beams. The other 4 spots are the second passes off the grating for each of the 4 measurement beams.

Figure 31:
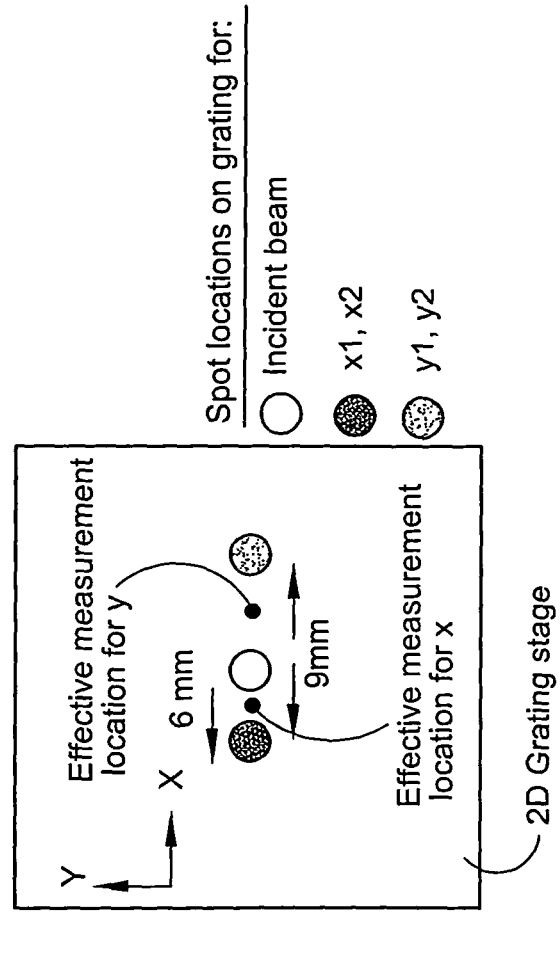
FIG. 31 shows the beam footprint for the In Line Gamma version of FIGS. 16-23.

FIG. 31 shows the beam footprint for the In Line Gamma. The incident beam is at the center, and it is the first pass off the grating for all 4 measurement beams. The x1, x2 beams go through a corner cube retroreflector 180 before going back to the grating for the second pass (at blue circle in Exhibit A). The y1, y2 beams go through the Dove-shaped air retroreflectors 108 back to the grating at the green circle (Exhibit A) for the second pass.

In the In Line Gamma shown in FIGS. 16-23, the retroreflectors 108 can be air retroreflectors, which are possibly easier to fabricate than all solid retroreflectors (two right angle prisms contacted to a flat bar mirror) in order to reduce the center to center distance between the diffraction locations on the grating 104 to 9 mm. The shorter distance here is the minimum achievable with thin retroreflectors 108 and corner cube retroreflectors 180, given a 3 mm beam diameter, and no overlap with an edge of the corner cube retroreflectors 180. Moreover, as seen from FIG. 21, the provision of the solid or air retroreflectors 108, with the relatively thin thickness 't' (FIG. 7) helps keep the distance D (FIG. 21) from the roof of the encoder head to the 2D grating relative small, which is a desirable characteristic for a system and method according to the present invention.

Further features of the In Line Gamma can be seen from the light path(s) in the In Line Gamma that are shown and described in FIGS. 24 through 28.

Figure 24:
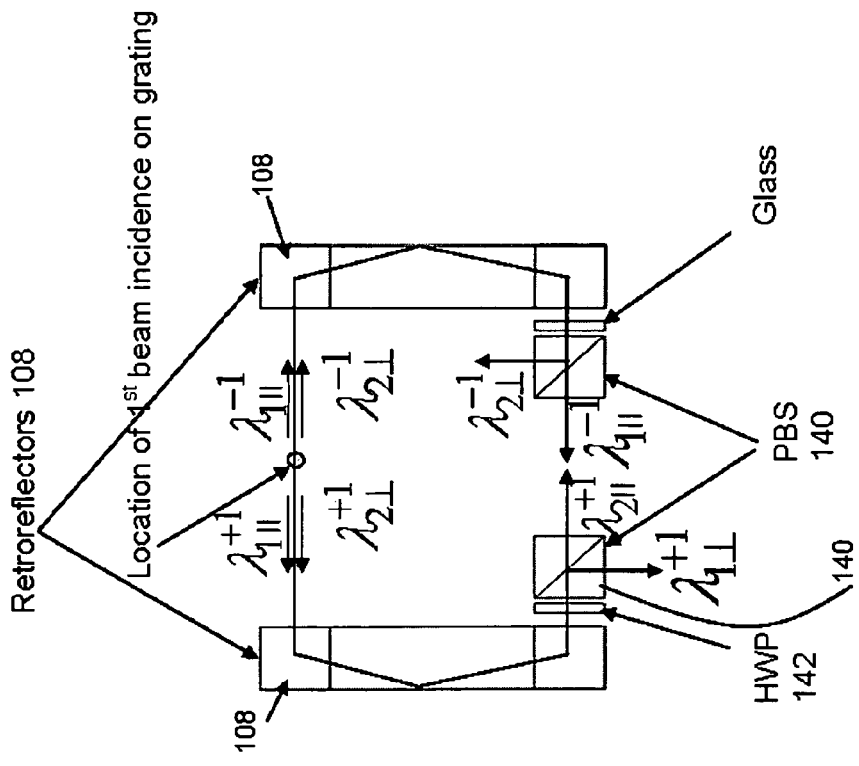

FIG. 24 illustrates the path taken by the first order diffraction in the x-direction immediately after the first incidence on the grating. Both wavelengths pass through the +1 and −1 paths, as shown, but a HWP+PBS (142+140) on the left sends the first wavelength away from the grating, while on the other side, the absence of a HWP sends the second wavelength away. In addition, the two wavelengths are directed from +1 and −1 directions back to the grating with the same polarization, so that the second diffraction produces heterodyne +1+1 and −1−1 signal, which is the main purpose behind the Gamma approach.

Figure 25:
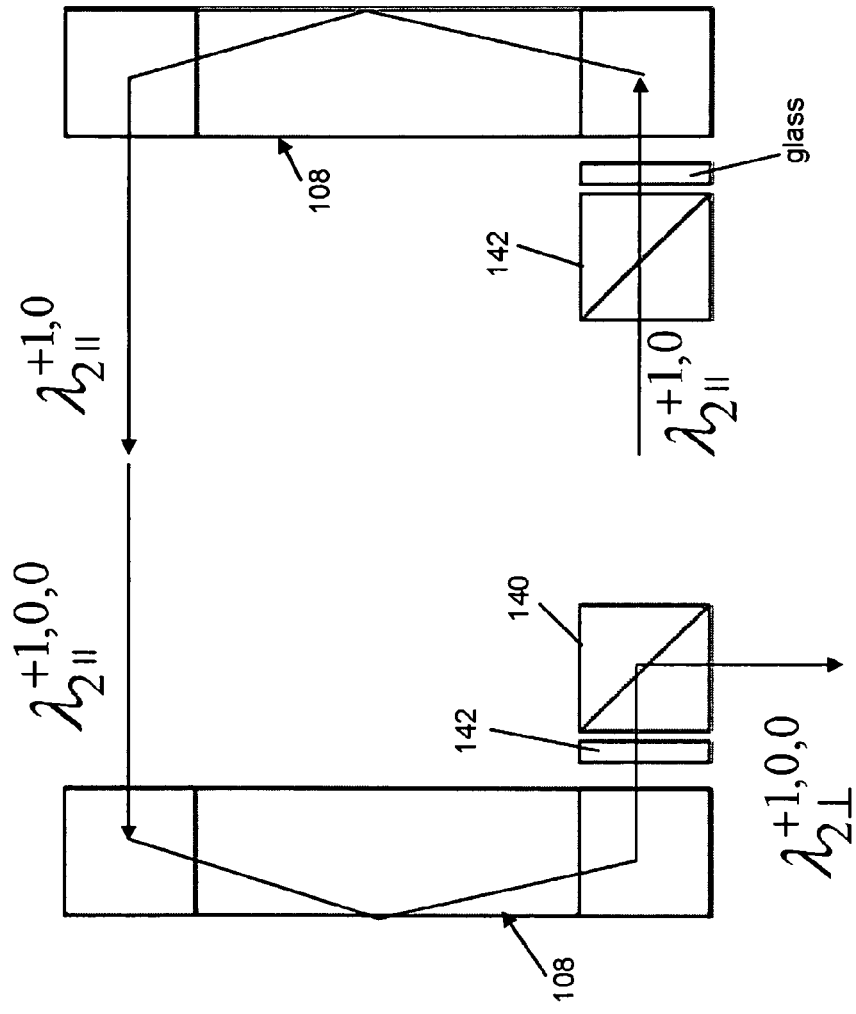

As shown by FIG. 25, the second diffraction from the grating produces a 0-order beam, which passes through the opposing PBS 140. This beam proceeds through the retroreflector 108 to the grating for a third diffraction. This third diffraction produces, among others, another 0-order diffraction that proceeds through the path taken by the original {+1} beam. After the {+1,0,0} leaves the retroreflector 108, it passes through the HWP+PBS (142+140) and is directed along the same path as the {+1 }, and is now the second wavelength producing a heterodyne signal. This signal from the interference of the {+1,0,0} and the {+1} beams has no dependence on X, but is ~4× sensitive to Z.

Figure 26:
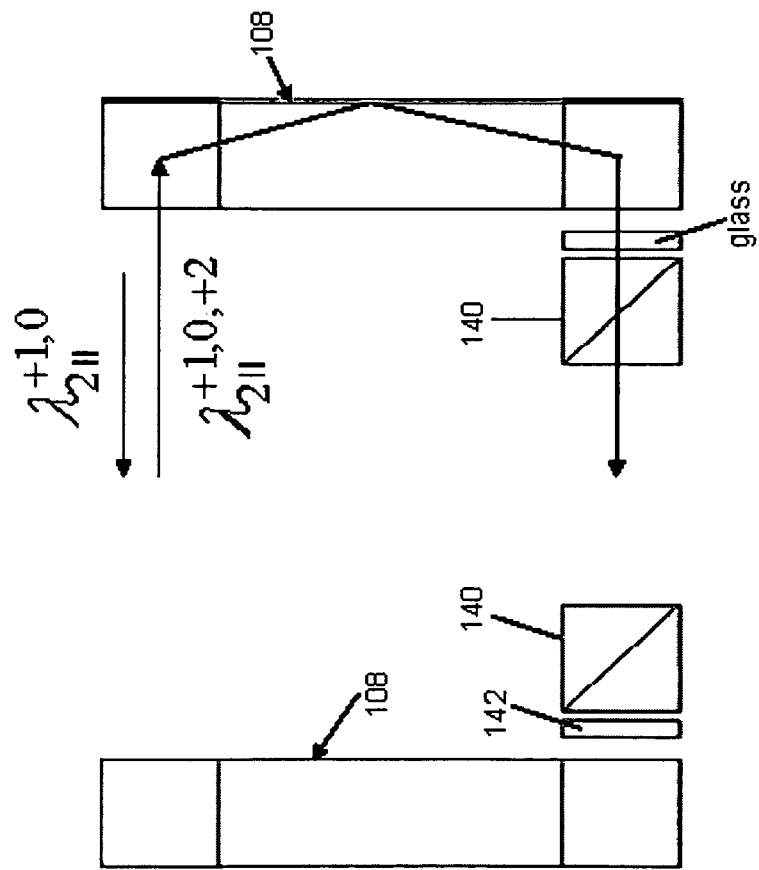

As shown by FIG. 26, in addition to the desirable {+1,0,0} diffraction order, which can be used for z-measurement, there may be a substantial {+1,0,+2} diffraction, which is like a Littrow diffraction back along the {+1,0} path. This beam will proceed back through the retroreflector 108 and contaminate the {+1,+1}/{−1,−1} heterodyne signal. In fact there are many other 2nd order diffraction beams that will contaminate the X and Y measurements.

Figure 27:
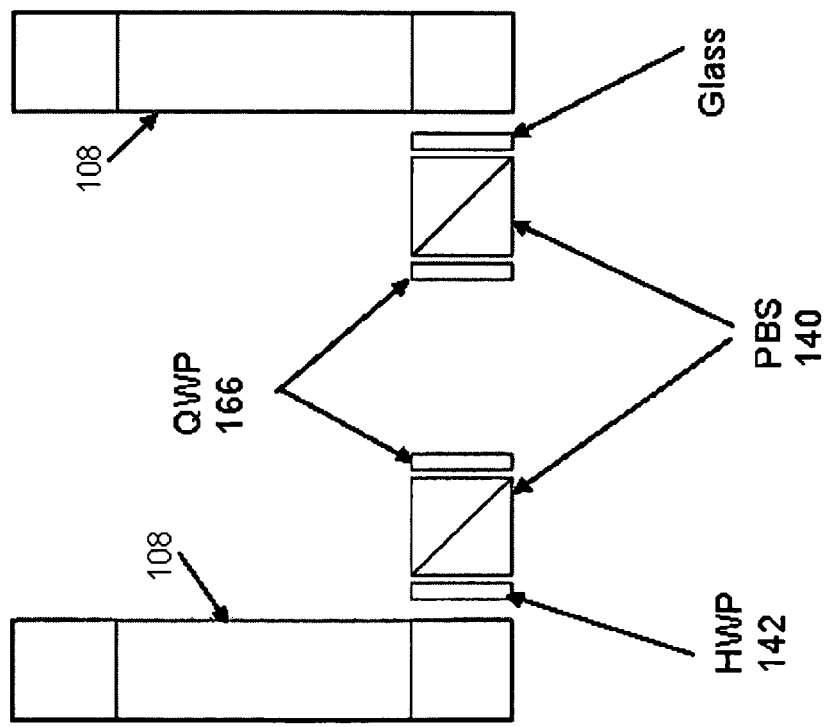

Referring to FIG. 27, this approach is to include an isolator (PBS 140+QWP 166) in each arm so that no light will go back through the isolator. This prevents any 2nd order beams from contaminating the x and y-measurements. However, it also sends circular polarization to the grating. The advantage of that approach is that it can be made to have zero dead path and zero unmatched glass path. The disadvantage is that it is also sensitive to X, but we don't see that as a difficult problem.

Figure 28:
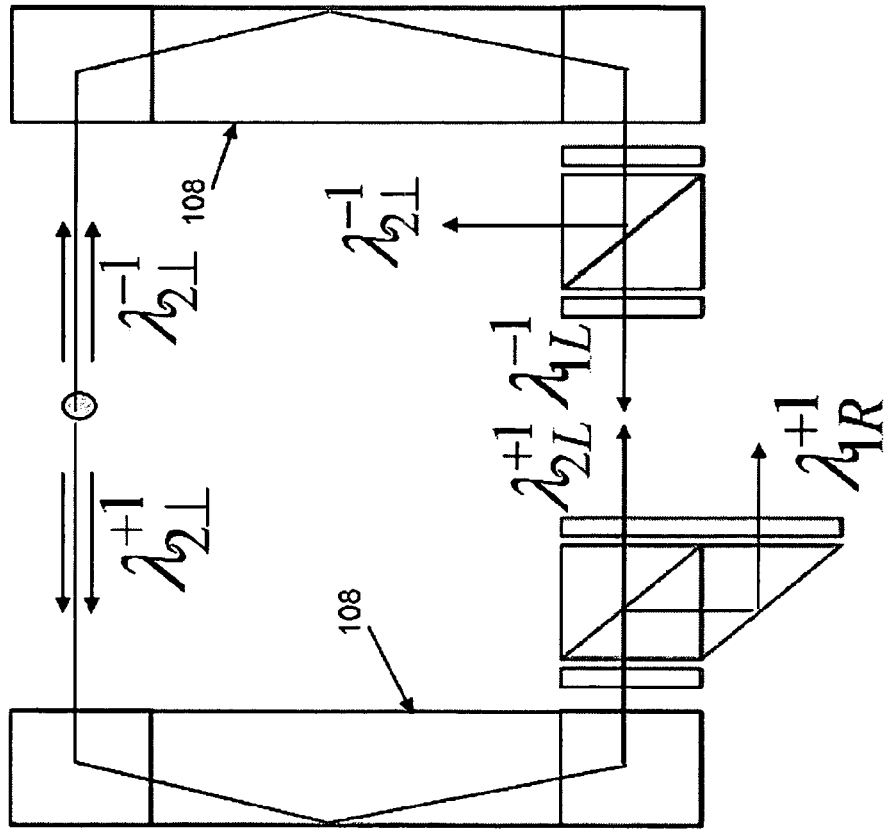

FIG. 28 illustrates how we can re-direct one of the beams reflected by the PBS 140 on first pass, to the grating for a second first order diffraction, which can then be interfered with a reference beam, which never encounters the grating, to produce a heterodyne signal sensitive to both x and z. This z measurement signal will have to be corrected for x, but is relatively free of cyclic errors.

In the In Line Gamma, many of the types of components that are used in the Shuriken are utilized, but in a configuration such that the measurement beam incidence locations lay substantially along a single line providing the system with a relatively narrow beam footprint on the grating. Thus, in FIGS. 16-23, the retroreflectors 108, the fold mirrors 143, 145, polarization beam splitters 140, stray light isolation plate 141, quarter and half wave plates (142, 166) are oriented in the manner illustrated, so that a beam directed to the encoder head, in the direction shown in FIGS. 16-23, is split into a pair of measurement beams that are diffracted from locations on the grating that are substantially in a single line (e.g. as schematically shown in FIG. 31), are diffracted twice from the grating, in the manner described herein, and combined, also in the manner described herein, to produce x, y and z measurement beams in the manner described and illustrated.

The In Line Gamma encoder is designed to result in the gamma-type interference shown and described herein, for light efficiency, and a small footprint (on the grating) to minimize the number of encoder heads.

Applicants also note that in both the Shuriken and gamma versions, other glass components (i.e. plates, other parts), that are not shown, are required to make the encoder heads into single integrally formed glass components. The parts are omitted in the drawings because they do not impact the optical performance, and their inclusion would make it more difficult to understand the structure and function of the system and method of the invention. However, from the foregoing detailed description, it will be clear to those in the art as to the nature, configurations and function of these additional mechanical glass parts.

Thus, as can be seen from the foregoing detailed description, the encoder system and method of the present invention, provide an encoder head and a substrate stage with a two dimensional (2D) grating that are moveable relative to each other and are configured to produce interfering measurement beams in both dimensions of the grating related to that relative movement, wherein at least a pair of the interfering measurement beams are diffracted at least twice by the grating. Moreover, in versions such as the Shuriken and Gamma versions, the encoder head comprises a single, integrally formed optical component through which the pair of measurement beams passes. Moreover, the encoder head includes one or more retroreflectors (e.g. the retroreflectors 108), each of which has a thickness that is about the thickness of a measurement beam (meaning that the thickness of the retroreflector is as close as possible to the thickness of a measurement beam, but is not thinner than a measurement beam). Still further, as described above in connection with the Shuriken and Gamma versions, the encoder head includes one or more optical members and one or more spaces between portions of the optical members, and the encoder head is configured to direct measurement beams along substantially equal paths through the optical members and the spaces between the portions of the optical members. Also, it should be clear that in the Shuriken version, the encoder head and the grating are configured such that the grating functions as a beam splitter, and that in the Gamma versions, the encoder head and the grating are configured such that the grating functions as a beam combiner. Still further, as should be clear from the Gamma versions, the encoder head is configured to provide polarization isolation and remove stray light in the system. Additionally, as seen from the In Line Gamma version, the encoder head and grating are configured such that the measurement beam incidence locations lay substantially along a single line providing the system with a relatively narrow beam footprint on the grating.

The invention claimed is:

1. An encoder system comprising:
    an encoder head, and
    a two dimensional (2D) grating,
    the encoder head and the grating being moveable relative to each other and being configured to produce interfering measurement beams in both dimensions of the grating that are related to that relative movement, wherein at least two of the interfering measurement beams are each diffracted at least twice by the grating as the grating and encoder head move relative to each other.

2. The encoder system of claim 1, wherein the encoder head comprises a single, integrally formed optical component through which the at least two of interfering measurement beams pass.

3. The encoder system of claim 2, wherein the encoder head includes one or more retroreflectors, each of which has a thickness that is about a thickness of a measurement beam.

4. The encoder system of claim 1, wherein the encoder head includes one or more optical members and one or more spaces between portions of said optical members, and wherein the encoder head is configured to direct the interfering measurement beams along substantially equal paths through said optical members and said spaces.

5. The encoder system of claim 4, wherein at least some of said optical members comprise retroreflectors, each of which has a thickness that is about a thickness of a measurement beam.

6. The encoder system of claim 1, wherein the encoder head and the grating are configured such that the grating functions as a beam splitter for the measurement beams.

7. The encoder system of claim 1, wherein the encoder head and the grating are configured such that the grating functions as a beam combiner for the measurement beams.

8. The encoder system of claim 1, wherein the encoder head is formed by one or more retroreflectors, each of which has a thickness that is about a thickness of a measurement beam.

9. The encoder system of claim 1, wherein the encoder head is configured to provide polarization isolation of the interfering measurement beams.

10. The encoder system of claim 1, wherein the encoder head and grating are configured such that the interfering measurement beam incidence locations lay substantially along a single line defining a beam footprint on the grating.

11. A method for producing interfering measurement beams relating to a relative movement of a two dimensional (2D) grating and an encoder head, the method comprising:
    directing a measurement beam with the encoder head towards a two dimensional (2D) diffraction grating to form diffracted measurement beams;
    using the encoder head to redirect said diffracted measurement beams, collected from the 2D grating, along both dimensions of said 2D grating as the encoder head moves relative to the 2D grating such as to interfere redirected diffracted measurement beams,
    wherein the 2D grating and encoder head being configured to cause each of at least two of the redirected diffracted measurement beams to be diffracted at least twice by said grating as the encoder head moves relative to said 2D grating.

12. The method of claim 11, wherein said using the encoder head includes using the encoder head that comprises a single, integrally formed optical component through which the at least two the redirected diffracted measurement beams pass.

13. The method of claim 12, wherein said using the encoder head includes using the encoder head to redirect said diffracted measurement beams through one or more retroreflectors, each of which retroreflectors has a thickness that is about a thickness of a measurement beam.

14. The method of claim 11, wherein said using the encoder head includes using the encoder head that
    contains one or more optical members and one or more spaces between portions of said optical members, and
    redirects said diffracted measurement beams along substantially equal paths through said optical members and said spaces.

15. The method of claim 14, wherein at least some of the optical members comprise retroreflectors, each of which has a thickness that is about a thickness of the measurement beam.

16. The method of claim 11, further comprising configuring the encoder head and the grating such that the grating functions as a beam splitter.

17. The method of claim 11, further comprising configuring the encoder head and the grating such that the grating functions as a beam combiner.

18. The encoder system of claim 11, wherein said using the encoder head includes using the encoder head to redirect said diffracted measurement beams through one or more retroreflectors, each of which has a thickness that is about a thickness of the measurement beam.

19. The method of claim 11, wherein said using the encoder head includes using the encoder head configured to provide polarization isolation of the diffracted measurement beams.

20. The encoder system of claim 11, further comprising configuring the encoder head and grating such that locations of beams, formed from the measurement beam, on the grating occur substantially along a single line representing a beam footprint on the grating.

* * * * *

UNITED STATES PATENT AND TRADEMARK OFFICE
CERTIFICATE OF CORRECTION

PATENT NO. : 8,829,420 B2  
APPLICATION NO. : 13/134461  
DATED : September 9, 2014  
INVENTOR(S) : Eric Peter Goodwin and Daniel Gene Smith It is certified that error appears in the above-identified patent and that said Letters Patent is hereby corrected as shown below:

In the Claims

Column 13, Claim 2, line 39, change "two of interfering" to -- two of the interfering --

Column 14, Claim 10, line 5, change "head and grating" to -- head and the grating --

Column 14, Claim 12, line 27, change "least two the" to -- least two of the --

Column 14, Claim 18, line 54, change "of the measurement" to -- of a measurement --

Signed and Sealed this  
Tenth Day of February, 2015

Michelle K. Lee  
*Deputy Director of the United States Patent and Trademark Office*